United States Patent [19]

Matsuo et al.

[11] Patent Number: 5,658,711
[45] Date of Patent: Aug. 19, 1997

[54] METHOD OF FORMING MICROPATTERNS

[75] Inventors: Takahiro Matsuo, Kyoto; Kazuhiro Yamashita, Hyogo; Masayuki Endo; Masaru Sasago, both of Osaka, all of Japan

[73] Assignee: Matsushita Electric Industrial Co., Ltd., Osaka, Japan

[21] Appl. No.: 563,970

[22] Filed: Nov. 29, 1995

Related U.S. Application Data

[62] Division of Ser. No. 497,471, Jun. 30, 1995, abandoned.

[30] Foreign Application Priority Data

Jul. 5, 1994 [JP] Japan .................................. 6-153538

[51] Int. Cl.$^6$ ............................................................ G03F 7/004
[52] U.S. Cl. ........................... 430/324; 430/325; 430/323; 430/313
[58] Field of Search ................................... 430/325, 323, 430/324, 313

[56] References Cited

U.S. PATENT DOCUMENTS 5,278,029  1/1994  Shirai et al. ............................ 430/325

FOREIGN PATENT DOCUMENTS 0599571  6/1994  European Pat. Off. ............... 430/323

Primary Examiner—George F. Lesmes
Assistant Examiner—Steven H. VerSteeg
Attorney, Agent, or Firm—McDermott, Will & Emery

[57] ABSTRACT

A relatively thick metal oxide film of 100 nm or more is formed in the exposed portion of a resist film by supplying water and a metal alkoxide thereto, and then evaporating the alcohol generated by the supply of metal alkoxide to form a precise resist pattern from the metal oxide film. Water is absorbed into the exposed portion of the resist film in which the acid has been generated and the water is diffused deeper into the surface thereof. The growth of the metal oxide film proceeds toward the interior of the resist film. The water absorbed by the resist film is prevented from being evaporated, thereby forming a metal oxide film with a sufficiently large thickness to withstand dry etching.

6 Claims, 19 Drawing Sheets

F I G. 12 (a)
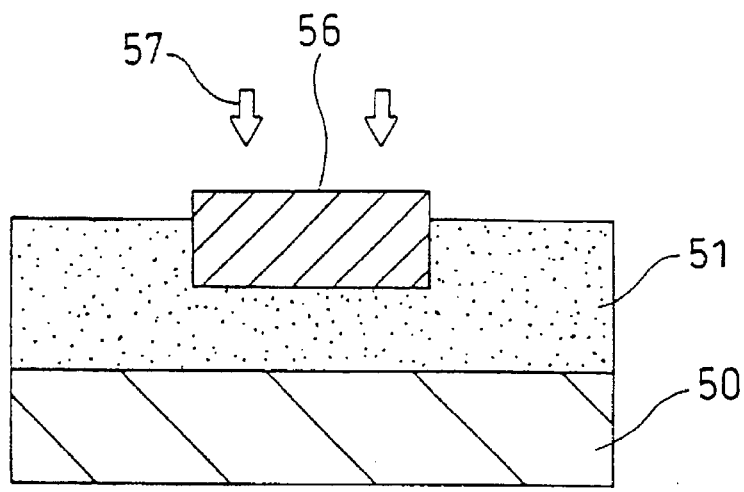
F I G. 12 (b)
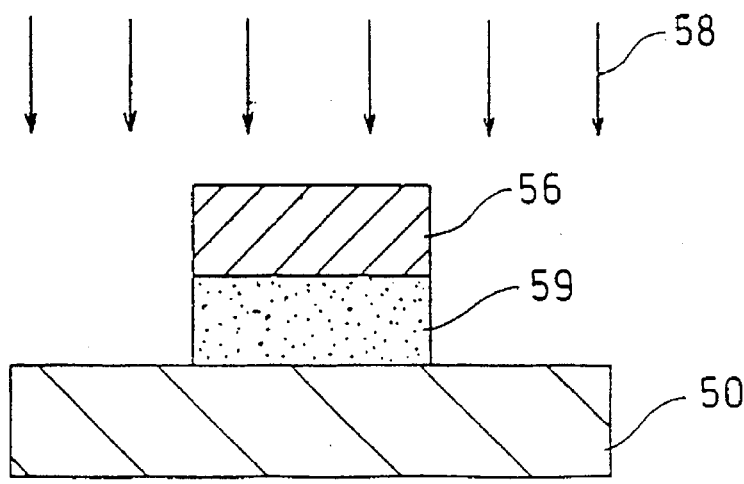

F I G. 13 (a)
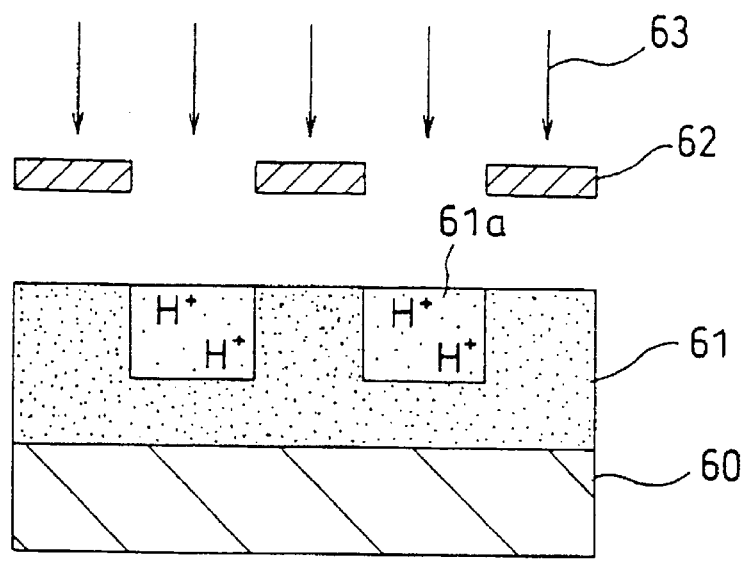
F I G. 13 (b)
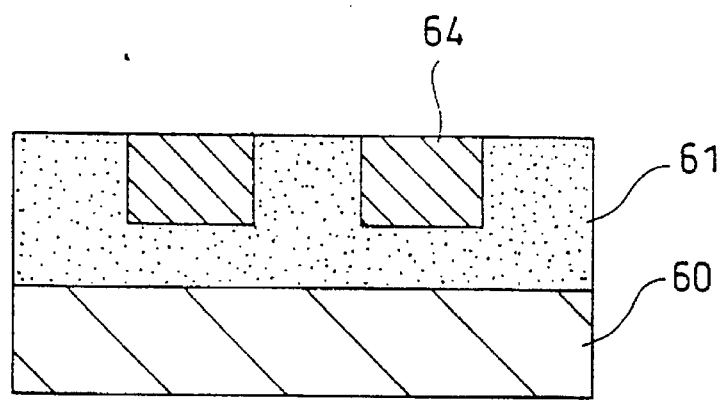
F I G. 13 (c)
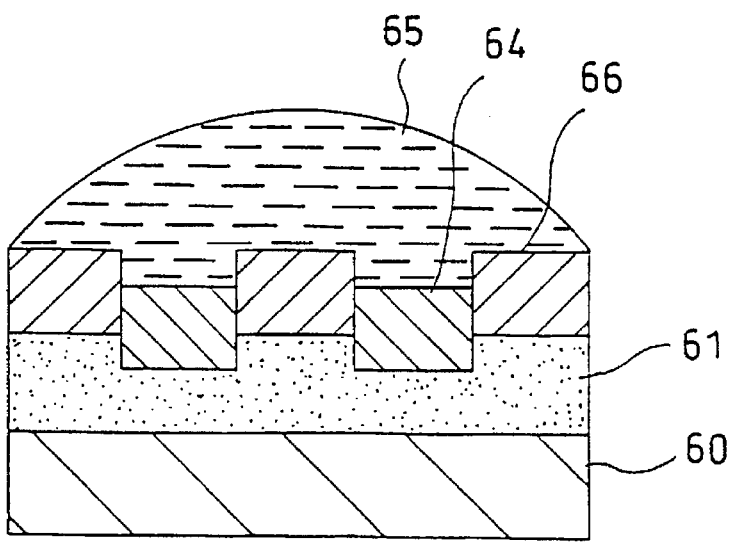

METHOD OF FORMING MICROPATTERNS

This is divisional of application Ser. No. 08/497,471, filed Jun. 30, 1995, now abandoned.

BACKGROUND OF THE INVENTION

The present invention relates to a method of forming micropatterns in the process of fabricating semiconductor integrated-circuit devices or the like.

In a conventional process of manufacturing ICs or LSIs, patterns are generally formed by photolithography using an ultraviolet ray. With the miniaturization of semiconductor devices, however, a light source of a shorter wavelength has been used increasingly. As a resist compatible with the light source of a shorter wavelength, there has been used a chemical amplification resist which provides high sensitivity as well as high resolution (e.g., O. NALAMASU et. al., Proc. SPIE, 1262, 32(1990)).

The chemical amplification resist is a multi-component resist containing an acid generator which generates an acid in response to the radiation of an energy beam and a compound which reacts with the acid. Among polymers which react with an acid, a compound with the structure as shown in the following [Formula 1] is known.

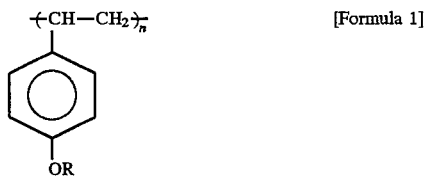

[Formula 1]

where R is an alkoxycarbonyl, alkyl, alkoxyalkyl, alkylsilyl, tetrahydropyranyl, alkoxycarbonylmethyl, or like group, which is easily decomposed by an acid. Such a chemical amplification resist contains, as its main component, a polymer which presents a low absorption index with respect to light in the range of shorter wavelengths, such as a derivative of polyvinyl phenol. Accordingly, the transparency of the chemical amplification resist is increased and the reaction of the resist proceeds through a chain reaction induced by an acid catalyst, resulting in high sensitivity and high resolution. Hence, the chemical amplification resist is considered as a promising material for forming micropatterns by utilizing a light source of a shorter wavelength.

At present, a vigorous study is being directed to the formation of a resist pattern of 0.2 μm or less in size in accordance with a deep-ultraviolet-ray exposure method using such a chemical amplification resist. However, since the aspect ratio of a resist pattern becomes higher with the increasing miniaturization thereof, a conventional wet developing method is disadvantageous for the following reason. Specifically, a resist film coated on a semiconductor substrate is exposed to a deep ultraviolet ray and then developed, resulting in a resist pattern. After that, a developing solution and the resist material dissolved in the developing solution are washed away from the resist pattern with pure water. Finally, the resist pattern is subjected to spin drying, which involves the rotation of the resist pattern at a high speed.

In the step of drying the resist pattern, however, large surface tension acts on pure water 82 remaining between adjacent resist patterns 81 formed on that region of a semiconductor substrate 80 having a high aspect ratio, as shown in FIG. 16(a). As a result, the resist patterns 81 are distorted or broken by the large surface tension exerted thereon, thereby causing a phenomenon that the resist patterns are leaning against their adjacent resist patterns, as shown in FIGS. 16(b) and 16(c). The phenomenon is similarly observed in the case of using a normal resist, instead of using the chemical amplification resist.

To eliminate the disadvantage, there has been proposed a method for forming a resist pattern by performing dry etching with respect to a resist film of chemical amplification type, as disclosed in U.S. Pat. No. 5,278,029. Below, a description will be given to the method with reference to FIGS. 17(a) and 17(b) and to FIGS. 18(a) and 18(b).

Initially, as shown in FIG. 17(a), a resist film 91 of chemical amplification type coated on a semiconductor substrate 90 is irradiated with KrF excimer laser light 93 through a mask 92, thereby generating an acid in an exposed portion 91a of the resist film 91. The exposed portion 91a is made hydrophilic by the action of the resulting acid and hence is apt to absorb water in the atmosphere. Consequently, a thin absorption layer 94 of water is naturally formed on the surface of the exposed portion 91a.

Subsequently, an alkoxysilane gas is introduced into the surface of the resist film 91, thereby forming an oxide film 95 on the surface of the exposed portion 91a, as shown in FIG. 18(a). Thereafter, dry etching by RIE using an $O_2$ plasma 96 is performed with respect to the resist film 91 through the oxide film 95 as a mask, thereby forming a minuscule resist pattern 97, as shown in FIG. 18(b).

However, the resist pattern actually formed in accordance with the above method was disadvantageous in that the oxide film 95 was caused to flow in a step of evaporating an alcohol, resulting in an increased degree of edge roughness of the oxide film 95, which deteriorates the size precision of the resist pattern. As a result of diagnostic examination, the deformation of the oxide film 95 was attributed to the thinness of the oxide film 95.

SUMMARY OF THE INVENTION

In view of the foregoing, an object of the present invention is to enable the formation of a thick oxide film in an exposed portion of a resist film by supplying a metal alkoxide to the surface of the resist film, thereby increasing the size precision of a resist pattern.

To attain the above object, the present inventors examined the reason why only a thin oxide film is formed when an alkoxysilane gas is supplied to the surface of the exposed portion and found the following fact. That is, since a relative humidity in the environment inside a clean room is kept as low as 50% or less, the water in the atmosphere is difficult to be diffused into the resist film, so that it is diffused only in the surface region of the resist film. Hence, if the exposed portion of the resist film is simply allowed to stand in the atmosphere, the thickness of the oxide film formed on the surface of the exposed portion of the resist film becomes small. The present invention, which has been achieved based on the above finding, is for forming a metal oxide film with a sufficiently large thickness by causing the exposed portion of the resist film to absorb water and then supplying water and a metal alkoxide thereto.

A first method of forming a micropattern according to the present invention comprises: a first step of forming a resist film by applying, onto a semiconductor substrate, a resist containing an acid generator which generates an acid in response to the radiation of an energy beam; second step of causing the acid generator contained in an exposed portion of the resist film to generate the acid by irradiating the resist film with the energy beam; a third step of causing the exposed portion of the resist film, in which the acid has been generated, to absorb water; a fourth step of forming a metal oxide film in the exposed portion of the resist film by supplying water and a metal alkoxide to a surface of the exposed portion of the resist film having absorbed the water; and a fifth step of forming a resist pattern by performing dry etching with respect to the above resist film by using the metal oxide film as a mask.

According to the first method of forming a micropattern, since water is absorbed into the exposed portion of the resist film in which the acid has been generated, the water is diffused from the surface thereof into a deep portion. Moreover, since the metal oxide film is formed in the exposed portion of the resist film by supplying the water and metal alkoxide to the surface of the exposed portion of the resist film having absorbed water, the growth of the metal oxide film proceeds toward the interior of the resist film. Therefore, the water absorbed by the resist film is prevented from being evaporated, while water required to form the metal oxide film is supplied, so that water sustains its state of equilibrium, thereby forming a metal oxide film with a sufficiently large thickness to withstand dry etching. Consequently, a resist pattern with a high aspect ratio can be formed with high precision.

In the fourth step, either vapor of the metal alkoxide or a solution of the metal alkoxide may be supplied.

Preferably, the first method of forming a micropattern further comprises, between the first step and the second step, a step of forming, in a surface of the resist film, a resin film made of a contrast enhanced resin which shows, in response to the radiation of the energy beam, an increased transmittance with respect to the energy beam, and, between the second step and the third step, a step of removing the resin film formed on the surface of the resist film.

Since this arrangement enhances the contrast of light intensity on the resist film, the acid is efficiently generated in the exposed portion. As a result, the hydrophilicity of the exposed portion is increased and water is efficiently absorbed. Consequently, the metal oxide film grows toward the interior of the resist, thereby successfully forming a metal oxide film with a sufficiently large thickness.

In the first method of forming a micropattern, the fourth step preferably comprises a step of forming a metal oxide film in the exposed portion of the resist film by alternately performing the step of supplying water and the metal alkoxide to the surface of the exposed portion of the resist film having absorbed the water and a step of supplying a dry inert gas to the surface of the exposed portion of the resist film having absorbed the water.

With the arrangement, an alcohol generated by the supply of the metal alkoxide and imparting mobility to the metal oxide film is evaporated each time it is generated, so that the mobility of the metal oxide film is surely lowered. Consequently, the metal oxide film excellently retains its initial configuration, thereby forming a resist pattern with a high aspect ratio with extremely high precision.

Preferably, the first method of forming a micropattern further comprises, between the fourth step and the fifth step, a step of curing the metal oxide film formed in the fourth step. With the arrangement, the mobility of the metal oxide film is surely lowered and the metal oxide film excellently retains its initial configuration. Consequently, a resist pattern with a high aspect ratio can be formed with extremely high precision.

In the first method of forming a micropattern, a thickness of the metal oxide film formed in the fourth step is preferably 100 nm or more. With the arrangement, the metal oxide film excellently retains its initial configuration, so that a resist pattern with a high aspect ratio can be formed with extremely high precision.

In the first method of forming a micropattern, the acid generated from the acid generator in the second step is preferably a sulfonic acid.

A second method of forming a micropattern according to the present invention comprises: a first step of forming a resist film by applying, onto a semiconductor substrate, a resist containing a base generator which generates a base in response to the radiation of an energy beam; a second step of causing the base generator contained in an exposed portion of the resist film to generate the base by irradiating the resist film with the energy beam; a third step of causing the exposed portion of the resist film, in which the base has been generated, to absorb water; a fourth step of forming a metal oxide film in the exposed portion of the resist film by supplying water and a metal alkoxide to a surface of the exposed portion of the resist film having absorbed the water; and a fifth step of forming a resist pattern by performing dry etching with respect to the resist film by using the metal oxide film as a mask.

According to the second method of forming a micropattern, a metal oxide film with a sufficiently large thickness to withstand dry etching can be formed, similarly to the first method of forming a micropattern, thereby forming a resist pattern with a high aspect ratio with high precision.

In the fourth step of the second method of forming a micropattern, either vapor of the metal alkoxide or a solution of the metal alkoxide may be supplied.

Preferably, the second method of forming a micropattern further comprises, between the first step and the second step, a step of forming, in a surface of the resist film, a resin film made of a contrast enhanced resin which shows, in response to the radiation of the energy beam, an increased transmittance with respect to the energy beam, and, between the second step and the third step, a step of removing the resin film formed on the surface of the resist film. With the arrangement, the contrast of light intensity on the resist film is enhanced, so that the base is efficiently generated in the exposed portion, resulting in increased hydrophilicity of the exposed portion. Consequently, a metal oxide film with a sufficiently large thickness can be formed excellently.

In the second method of forming a micropattern, the fourth step preferably comprises a step of forming a metal oxide film in the exposed portion of the resist film by alternately performing the step of supplying water and the metal alkoxide to the surface of the exposed portion of the resist film having absorbed the water and a step of supplying a dry inert gas to the surface of the exposed portion of the resist film having absorbed the water. With the arrangement, an alcohol generated by the supply of the metal alkoxide and imparting mobility to the metal oxide film is evaporated each time it is generated, so that the mobility of the metal oxide film is surely reduced. Consequently, the metal oxide film excellently retains its initial configuration, thereby forming a resist pattern with a high aspect ratio with extremely high precision.

Preferably, the second method of forming a micropattern further comprises, between the fourth step and the fifth step, a step of curing the metal oxide film formed in the fourth step. With the arrangement, the mobility of the metal oxide film is surely lowered and the metal oxide film excellently retains its initial configuration. Consequently, a resist pattern with a high aspect ratio can be formed with extremely high precision.

In the second method of forming a micropattern, a thickness of the metal oxide film formed in the fourth step is preferably 100 nm or more. With the arrangement, the metal oxide film excellently retains its initial configuration, so that a resist pattern with a high aspect ratio can be formed with extremely high precision.

In the second method of forming a micropattern, the base generated from the base generator in the second step is preferably an amine.

A third method of forming a micropattern according to the present invention comprises: a first step of forming a resist film by applying, onto a semiconductor substrate, a resist containing a compound which is crosslinked in response to the radiation of an energy beam; a second step of crosslinking an exposed portion of the resist film by irradiating the resist film with the energy beam; a third step of forming a silylated layer in an unexposed portion of the resist film by supplying a silylating agent to a surface of the resist film; a fourth step of irradiating the silylated layer with a high energy beam; and a fifth step of forming a resist pattern by performing etching with respect to the resist film by using, as a mask, the silylated layer which has been irradiated with the high energy beam.

According to the third method of forming a micropattern, the irradiation of the silylated layer formed in the unexposed portion of the resist film with the high energy beam causes the oxidative decomposition and volatilization of a carbon compound composing the silylated layer, resulting in an increased concentration of silicon in the silylated layer and an increased selectivity to the silylated layer and the resist film. Consequently, a resist pattern with a high aspect ratio can be formed with high precision.

A fourth method of forming a micropattern according to the present invention comprises: a first step of applying, onto a semiconductor substrate, a resist film; a second step of exposing the resist film such that a pattern is transferred thereto; a third step of forming a resist pattern by developing the exposed resist film with a developing solution; and a fourth step of washing away the developing solution and a resist material dissolved in the developing solution with a rinse containing a surface-active agent.

According to the fourth method of forming a micropattern, the developing solution and the resist material dissolved in the developing solution are washed away with a rinse containing a surface-active agent. Accordingly, the surface tension acting on the rinse between minuscule resist patterns is reduced, so that the resist patterns are no more leaning against each other. Consequently, a resist pattern with a high aspect ratio can surely be formed.

In the fourth method of forming a micropattern, the surface-active agent contained in the rinse in the fourth step is preferably polyoxyethylene propylene glycol.

In the fourth method of forming a micropattern, the resist film in the first step is preferably composed of a chemical amplification resist containing an acid generator which generates an acid in response to the radiation of an energy beam and a compound in which at least a part of a phenolic hydroxy group is substituted by a protecting group eliminated by the acid. In this case, it is preferred that the fourth method of forming a micropattern further comprises, between the second step and the third step, a step of heating the exposed resist film. With the arrangement, the action of the acid to eliminate the protecting group is activated by the application of heat, so that the reaction of developing the resist film is accelerated.

BRIEF DESCRIPTION OF THE DRAWINGS

FIGS. 10(a) to 10(c), FIGS. 11(a) and 11(b), and FIGS. 12(a) and 12(b) are cross sections showing individual steps of forming a micropattern according to a fifth embodiment of the present invention;

FIGS. 13(a) to 13(c) and FIGS. 14(a) and 14(b) are cross sections showing individual steps of a method of forming a micropattern according to a sixth embodiment of the present invention;

DETAILED DESCRIPTION OF THE INVENTION

First Embodiment

FIGS. 1(a) to 1(c) and FIGS. 2(a) and 2(c) are cross sections showing individual steps of a method of forming a micropattern according to a first embodiment of the present invention.

As a chemical amplification resist, there is used a resist containing an acid generator which generates an acid in response to the radiation of an energy beam, such as a copolymer of 1,2,3,4-tetrahydronaphthyridineimino p-styrenesulfonate (NISS) as the acid generator and methyl methacrylate (MMA).

Figure 1A:
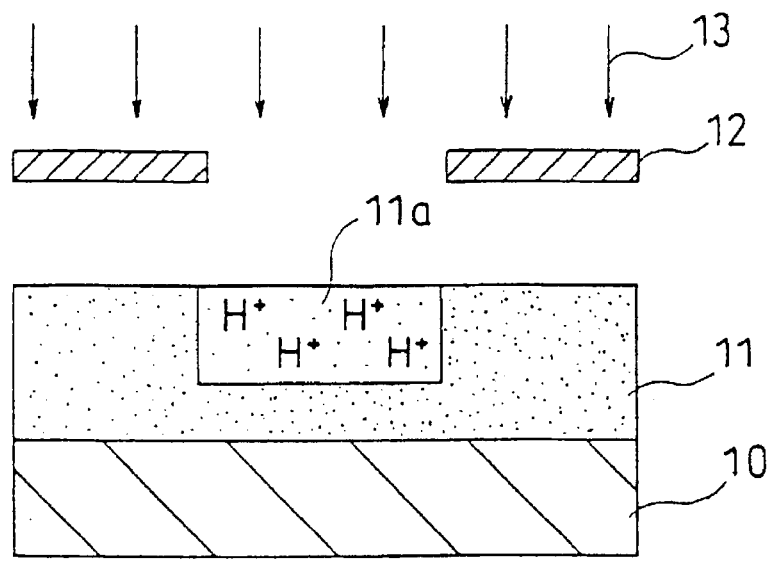
FIGS. 1(a) to 1(c) and FIGS. 2(a) and 2(b) are cross sections showing individual steps of a method of forming a micropattern according to a first embodiment of the present invention.

Initially, as shown in FIG. 1(a), the above chemical amplification resist is applied onto a semiconductor substrate 10 made of silicon by spin coating and then heated for 60 seconds at a temperature of 90° C., thereby forming a resist film 11 with a thickness of 1.2 μm. The resulting resist film 11 is then irradiated with KrF excimer laser light 13 as the energy beam through a mask 12, thereby transferring the pattern of the mask 12 to the resist film 11 by exposure. As a result, NISS is decomposed in the surface of an exposed portion 11a of the resist film 11 to generate an acid, which renders the surface of the exposed portion 11a of the resist film 11 hydrophilic.

Figure 1B:
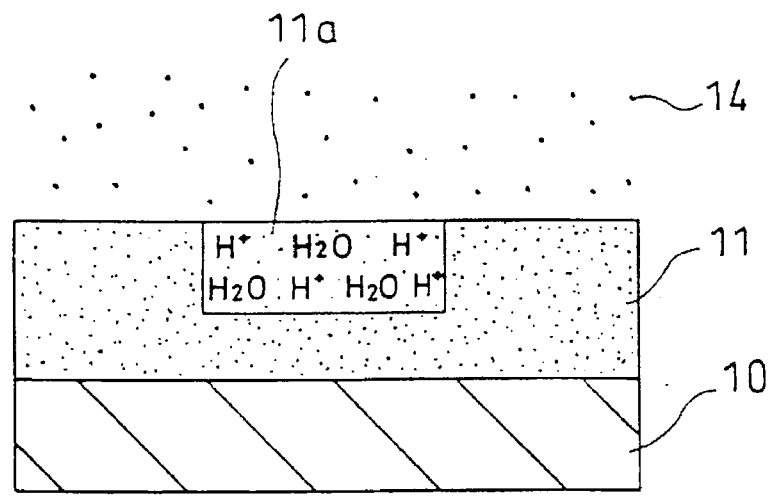

Next, as shown in FIG. 1(b), the semiconductor substrate 10 is kept in air at a temperature of 30° C. and a relative humidity of 95% for 30 minutes, thereby supplying water vapor 14 to the surface of the resist film 11. As a result, the surface of the exposed area 11a of the resist film 11 absorbs the water vapor 14, so that water is diffused from the surface of the exposed portion 11a of the resist film 11 into a deep portion, e.g., a portion 100 nm deep.

Figure 1C:
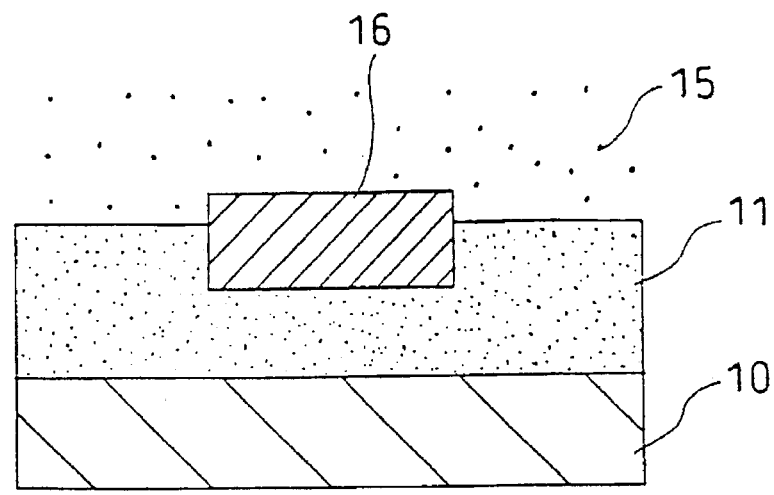

Next, as shown in FIG. 1(c), vapor 15 methyltriethoxysilane (MTEOS) as an metal alkoxide is sprayed onto the surface of the resist film 11 for 3 minutes, while the semiconductor substrate 10 is kept in the air at a temperature of 30° C. and a relative humidity of 95%, thereby selectively forming an oxide film 16 on the surface of the exposed portion 11a of the resist film 11. In this case, the acid ($H^+$) resulting from the decomposition of NISS serves as a catalyst and induces a reaction as represented by [Formula 2], thereby forming the oxide film 16 and generating an alcohol.

Since the water vapor 14 is supplied to the resist film 11 so that the water is diffused from the surface of the exposed portion 11a of the resist film 11 into a deep portion in the step shown in FIG. 1(b), the growth of the oxide film 16 proceeds toward the interior of the resist film 11, so that the oxide film 16 with a sufficiently large thickness can be formed. Moreover, since MTEOS is supplied to the resist film 11 in the air at a relative humidity of 95% in the step shown in FIG. 1(c), the evaporation of the water absorbed by the resist film 11 is prevented, while the water required to form the oxide film 16 is supplied, so that water sustains its state of equilibrium. Consequently, the oxide film 16 with a sufficiently large thickness to withstand RIE (reactive ion etching) using an $O_2$ plasma, which will be described later, can be formed.

[Formula 2]

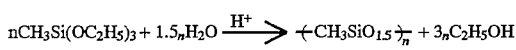

Figure 2A:
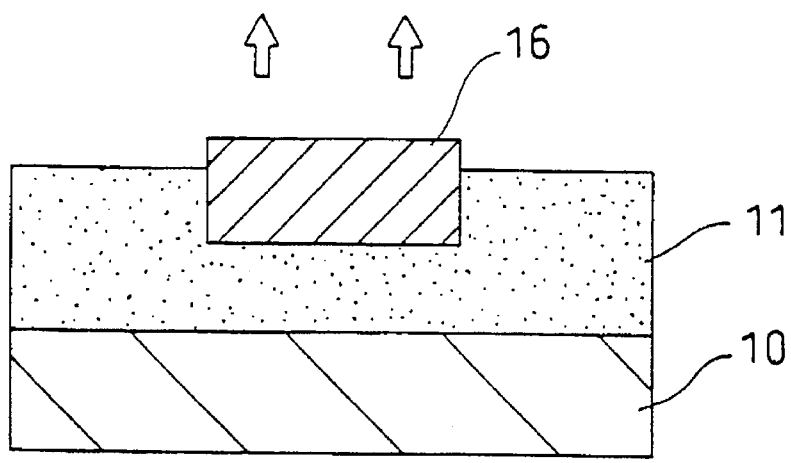
Figure 3A:
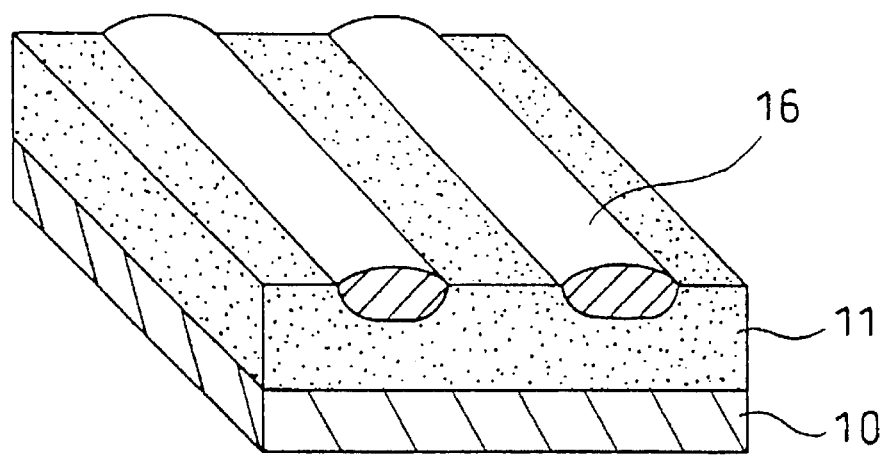
FIG. 3(a) is a perspective cross section of a metal oxide film formed in accordance with the method of forming a micropattern according to the above first embodiment and FIG. 3(b) is a cross section of a resist pattern formed in accordance with the method of forming a micropattern according to the above first embodiment.

Next, the resist film 11 is heated for 60 seconds at a temperature of 90° C. to volatilize the generated alcohol and unreacted water, as shown in FIG. 2(a), thereby curing the oxide film 16. As shown in FIG. 3(a), the oxide film 16 thus obtained retains its initial configuration.

[Table 1] shows the relationship between the period during which water vapor is supplied and the edge roughness of the resulting resist pattern. From [Table 1], it can be appreciated that, if the depth reached by diffused water is 100 nm or more, the resist pattern presents a reduced degree of edge roughness. Thus, the size precision of the resist pattern can be increased by regulating the depth reached by diffused water.

TABLE 1

| WATER VAPOR SUPPLY PERIOD | 0 min | 10 min | 20 min | 30 min |
|---|---|---|---|---|
| DEPTH REACHED BY DIFFUSED WATER | approx. 0 nm | 50 nm | 100 nm | 200 nm |
| EDGE ROUGHNESS OF PATTERN | x | x | o | o |

Figure 2B:
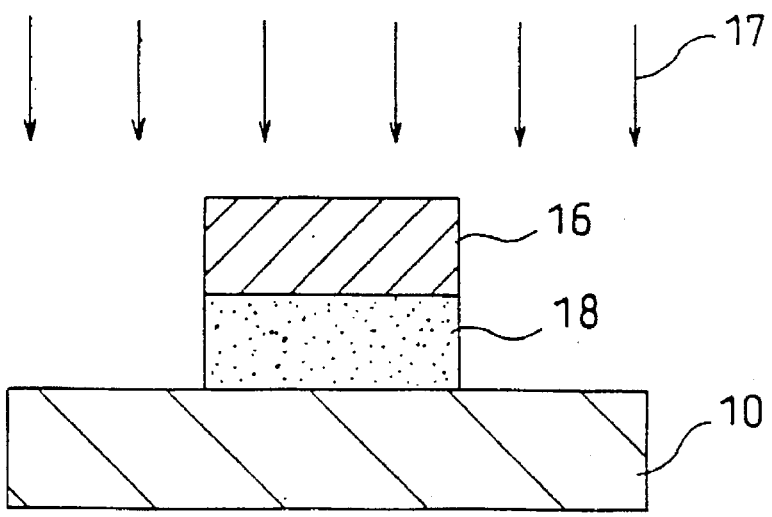

Next, as shown in FIG. 2(b), RIE is conducted using an $O_2$ plasma 17 through the cured oxide film 16 serving as a mask, thereby forming a resist pattern 18. In this case, the RIE using an $O_2$ plasma is conducted by means of a parallel plate RIE apparatus under the conditions of power: 900 W, pressure: 0.7 Pa, and flow rate: 40 SCCM.

Figure 3B:
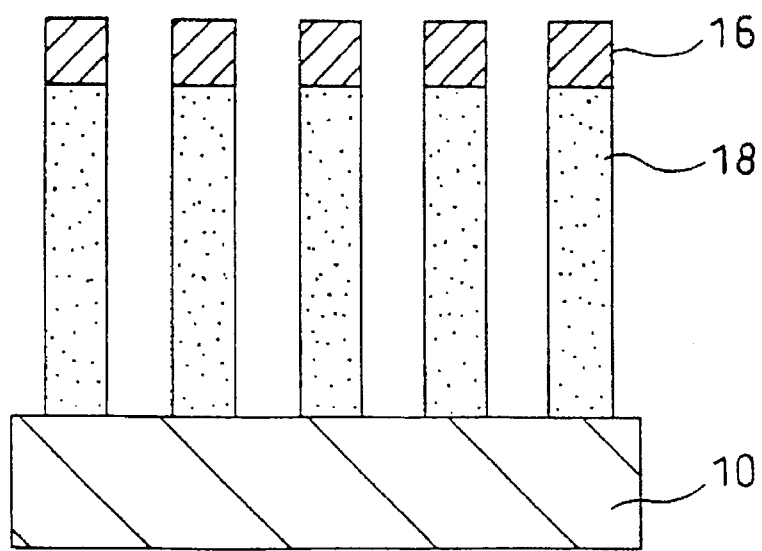

FIG. 3(b) shows the configuration of the resist pattern 18 with 0.2-μm lines and spaces formed in accordance with the method of forming a micropattern described above, in which exposure by means of a KrF excimer laser stepper having a numerical aperture of 0.42 is conducted using an alternating phase shifting mask. In this case, the thickness of the resist film 11 is 1.2 μm, so that the resist pattern 18 with a high aspect ratio of 6 or more can be formed.

Thus, according to the first embodiment, the oxide film 16 is selectively formed on the surface of the resist film 11 and the RIE using an $O_2$ plasma is performed with respect to the resist film 11 through the oxide film 16 as a mask, thereby conducting dry development. As a result, the problem of pattern collapse due to wet development is eliminated, while the oxide film 16 can retain its initial configuration excellently. Consequently, a micropattern with a high aspect ratio can be formed with high precision. Moreover, in the step of diffusing water in the exposed portion 11a of the resist film 11, the depth reached by diffused water can be controlled by regulating the period during which the water vapor 14 is supplied, i.e., the period during which the semiconductor substrate 10 is kept in the air at a temperature of 30° C. and a relative humidity of 95%.

Although the first embodiment uses a copolymer of NISS and MMA as a chemical amplification resist, it is also possible to use polyvinyl phenol, a novolac resin, or the like as a compound which reacts with the acid, instead of MMA. As an acid generator, a generator of a sulfonic acid or the like may be used instead of NISS.

Although MTEOS is used as vapor of a metal alkoxide, it is also possible to alternatively use another metal alkoxide such as tetramethylorthosilicate or tetraethylorthosilicate.

Although the RIE using an $O_2$ plasma is used as a method of dry development, ECR (electron cyclotron resonance etching) using an $O_2$ plasma or the like may be used instead.

Although the KrF excimer laser light is used as a light source for exposure, ArF excimer laser light or an X-ray may be used instead.

Although the semiconductor substrate 10 is kept in the water vapor in the step of diffusing water in the surface of the exposed portion 11a of the resist film 11, it is also possible to alternatively supply liquid water to the resist film 11 overlying the semiconductor substrate 10. However, the supply of water in vapor phase is more preferable than the supply of water in liquid phase, since the diffusion of water in vapor phase proceeds more swiftly, resulting in an increased thickness of the oxide film 16.

Second Embodiment

FIGS. 4(a) to 4(c) and FIGS. 5(a) and 5(b) are cross sections showing individual steps of a method of forming a micropattern according to a second embodiment of the present invention.

As a chemical amplification resist, there is used a resist containing a base generator which generates a base in response to the radiation of an energy beam, such as a mixture of 2-nitrobenzyl carbamate as a base generator and poly(methyl methacrylate) (PMMA).

Figure 4A:
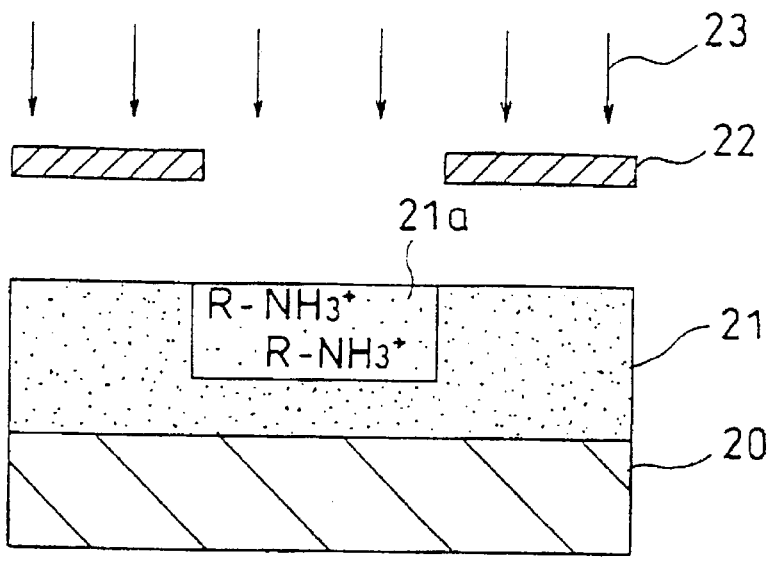
FIGS. 4(a) to 4(c) and FIGS. 5(a) and 5(b) are cross sections showing individual steps of a method of forming a micropattern according to a second embodiment of the present invention.

Initially, as shown in FIG. 4(a), a resist composed of the above chemical amplification resist is applied onto a semiconductor substrate 20 made of silicon by spin coating and then heated for 60 seconds at a temperature of 90° C., thereby forming a resist film 21 with a thickness of 1.2 μm. The resulting resist film 21 is then irradiated with KrF excimer laser light 23 as an energy beam through a mask 22, thereby transferring the pattern of the mask 22 to the resist film 21 by exposure. As a result, 2-nitrobenzyl carbamate is decomposed in the surface of an exposed portion 21a of the resist film 21 to generate an amine (base), which renders the surface of the exposed portion 21a of the resist film 21 hydrophilic.

Figure 4B:
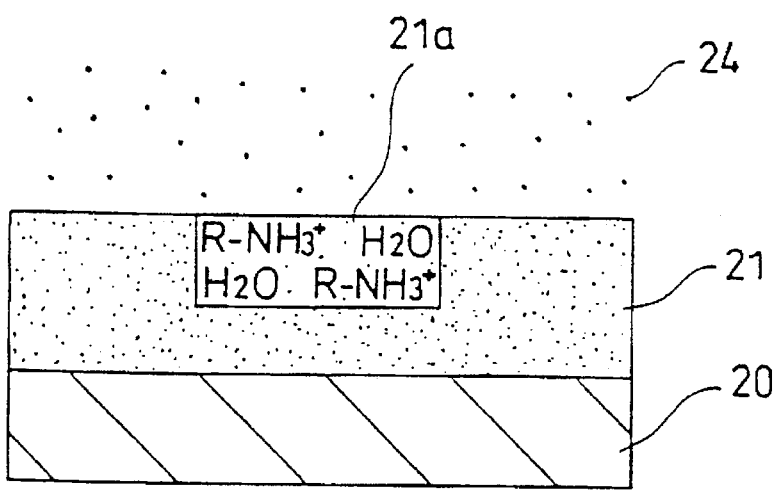
Figure 4C:
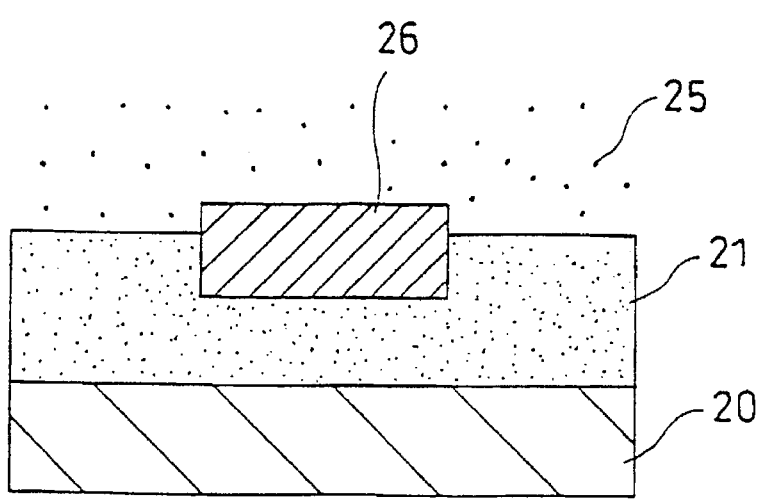

Next, as shown in FIG. 4(b), the semiconductor substrate 20 is kept in air at a temperature of 30° C. and a relative humidity of 95% for 30 minutes, thereby supplying water vapor 24 to the surface of the resist film 21. As a result, water is diffused from the surface of the exposed portion 21a of the resist film 21 into a deep portion, e.g., a portion 100 nm deep.

Next, vapor 25 of MTEOS is sprayed onto the surface of the resist film 21 for, e.g., 3 minutes, while the semiconductor substrate 20 is kept in the air at a temperature of 30° C. and a relative humidity of 95%, thereby selectively forming an oxide film 26 on the surface of the exposed portion 21a of the resist film 21. In this case, the amine ($R-NH_3^+$) resulting from the decomposition of 2-nitrobenzyl carbamate serves as a catalyst and induces a reaction as represented by [Formula 3], thereby forming the oxide film 26 and generating an alcohol.

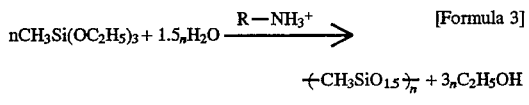

Figure 5A:
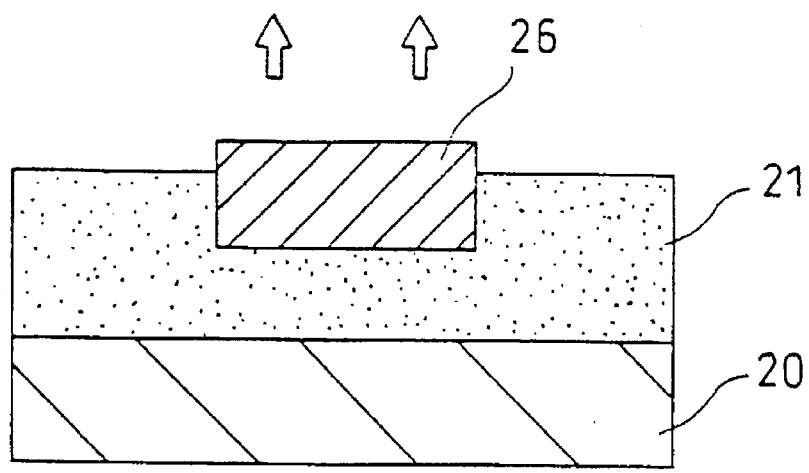

Next, the resist film 21 is heated for 60 seconds at a temperature of 90° C. to volatilize the generated alcohol and unreacted water, as shown in FIG. 5(a), thereby curing the oxide film 26. The oxide film 26 thus obtained retains its initial configuration.

Figure 5B:
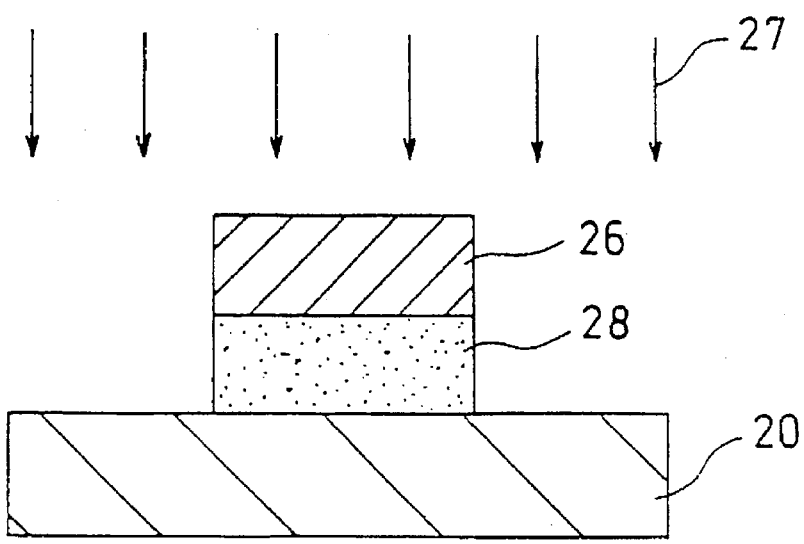

Next, as shown in FIG. 5(b), RIE is conducted using an $O_2$ plasma 27 through the cured oxide film 26 serving as a mask, thereby forming a resist pattern 28. In this case, the RIE using an $O_2$ plasma is conducted by means of a parallel plate RIE apparatus under the conditions of power: 900 W, pressure: 0.7 Pa, and flow rate: 40 SCCM.

Thus, according to the second embodiment, the oxide film 26 is selectively formed on the surface of the resist film 21 and the RIE using an $O_2$ plasma is performed with respect to the resist film 21 through the oxide film 26 as a mask, thereby conducting dry development. As a result, the problem of pattern collapse due to wet development is eliminated, while the oxide film excellently retains its initial configuration. Consequently, a micropattern with a high aspect ratio can be formed with high precision. Moreover, in the step of diffusing water in the exposed portion 21a of the resist film 21, the depth reached by diffused water can be controlled by regulating the period during which the water vapor 24 is supplied, i.e., the period during which the semiconductor substrate 20 is kept in the air at a temperature of 30° C. and a relative humidity of 95%. Similarly to the first embodiment, water is preferably diffused from the surface of the resist film 21 to a depth of 100 nm or more, since this prevents the oxide film 26 from flowing.

Although the second embodiment uses PMMA as a compound which composes the chemical amplification resist and which reacts with the base, polyvinyl phenol or a novolac resin may be used instead. Although 2-nitrobenzyl carbamate is used as a base generator, it is not limited thereto.

Although MTEOS is used as a metal alkoxide, it is also possible to alternatively use another metal alkoxide such as tetramethylorthosilicate or tetraethylorthosilicate.

Although the RIE using an $O_2$ plasma is used as a method of dry development, ECR (electron cyclotron resonance etching) using an $O_2$ plasma or the like may be used instead.

Although the KrF excimer laser light is used a light source for exposure, ArF excimer laser light or an X-ray may be used instead.

Although the semiconductor substrate 20 is kept in the water vapor in the step of diffusing water in the surface of the exposed portion 21a of the resist film 21, it is also possible to alternatively supply liquid water to the resist film 21 overlying the semiconductor substrate 20.

Third Embodiment

FIGS. 6(a) to 6(c) and FIGS. 7(a) and 7(b) are cross sections showing individual steps of a method of forming a micropattern according to a third embodiment of the present invention. As a chemical amplification resist, the third embodiment uses a copolymer of NISS and MMA.

Figure 6A:
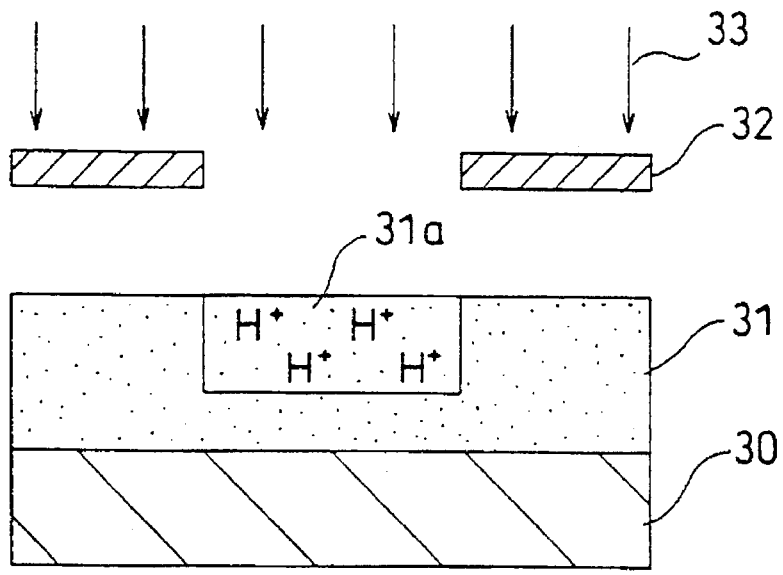
FIGS. 6(a) and 6(b) and FIGS. 7(a) and 7(b) are cross sections showing individual steps of a method of forming a micropattern according to a third embodiment of the present invention.

Initially, as shown in FIG. 6(a), a resist composed of the above chemical amplification resist is applied onto a semiconductor substrate 30 made of silicon by spin coating and then heated for 60 seconds at a temperature of 90° C., thereby forming a resist film 31 with a thickness of 1.2 μm. The resulting resist film 31 is then irradiated with KrF excimer laser light 33 as an energy beam through a mask 32, thereby transferring the pattern of the mask 32 to the resist film 31 by exposure. As a result, NISS is decomposed in the surface of an exposed portion 31a of the resist film 31 to generate an acid, which renders the surface of the exposed portion 31a of the resist film 31 hydrophilic.

Figure 6B:
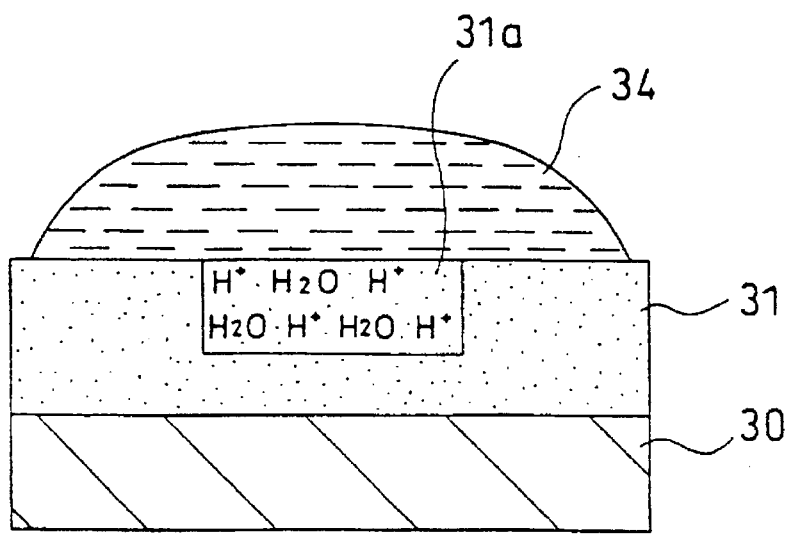

Next, as shown in FIG. 6(b), water 34 is kept on the surface of the resist film 31 for 30 minutes. As a result, the water is diffused from the surface of the exposed portion 31a of the resist film 31 into a deep portion, e.g., a portion 100 nm deep.

Subsequently, the surface of the resist film 31 is subjected to spin drying and then an alkoxysilane solution 35 as a metal alkoxide is kept on the resist film 31 for 5 minutes, thereby selectively forming an oxide film 36 on the surface of the exposed portion 31a of the resist film 31. The alkoxysilane solution used in the present embodiment is obtained by mixing MTEOS at a concentration of 0.2 mol/l into a mixture of hexane and acetone. The mixture ratio of hexane to acetone is 9:1. Thereafter, the resist film 31 and the oxide film 36 is rinsed with hexane, followed by spin drying. In this case, an acid resulting from the decomposition of NISS serves as a catalyst and induces a reaction as represented by the above [formula 2], thereby forming the oxide film 36 and generating an alcohol.

Figure 7A:
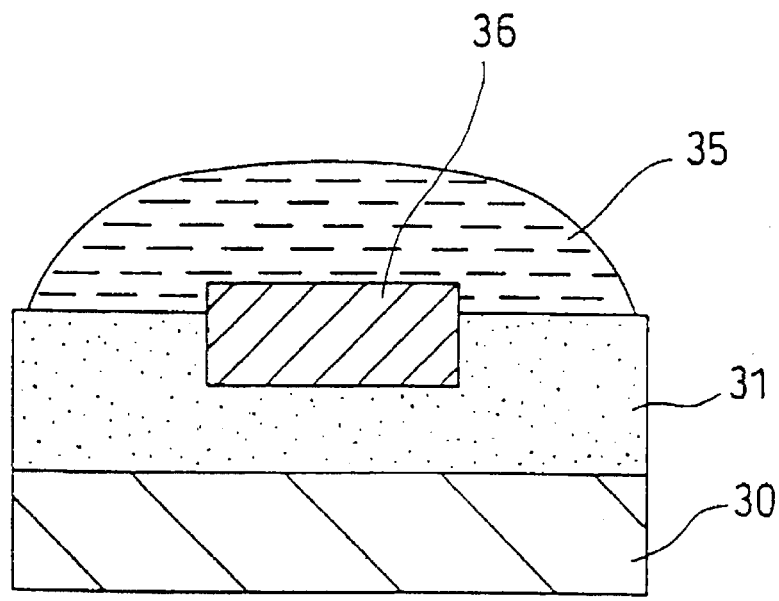
Figure 7B:
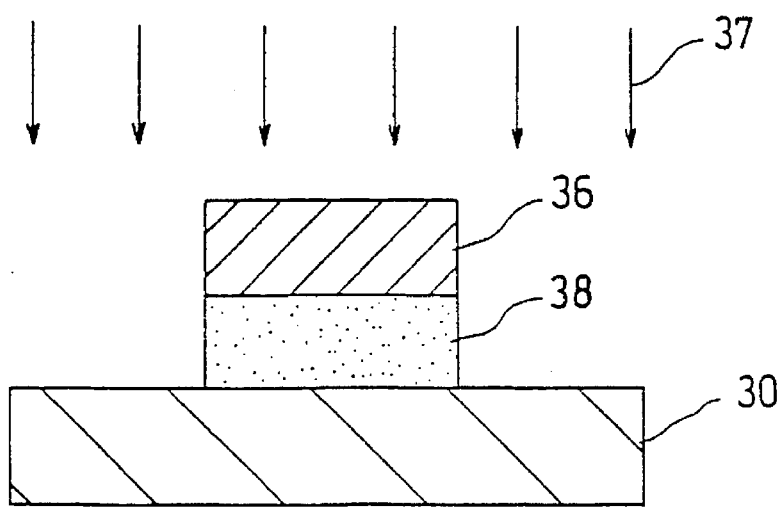

Next, as shown in FIG. 7(b), RIE is conducted using an $O_2$ plasma 37 through the cured oxide film 36 serving as a mask, thereby forming a resist pattern 38. In this case, the RIE using an $O_2$ plasma is conducted by means of a parallel plate RIE apparatus under the conditions of power: 900 W, pressure: 0.7 Pa, and flow rate: 40 SCCM.

Thus, according to the third embodiment, the oxide film 36 is selectively formed on the surface of the resist film 31 and the RIE using an $O_2$ plasma is performed with respect to the resist film 31 through the oxide film 36 as a mask, thereby conducting dry development. As a result, the problem of pattern collapse due to wet development is eliminated, while the oxide film excellently retains its initial configuration. Consequently, a micropattern with a high aspect ratio can be formed with high precision. Moreover, in the step of diffusing water in the exposed portion 31a of the resist film 31, the depth reached by diffused water can be controlled by regulating the period during which the water 34 is kept on the surface of the resist film 31. Similarly to the first embodiment, water is preferably diffused from the surface of the resist film 31 to a depth of 100 nm or more, since this prevents the oxide film 36 from flowing.

Although the third embodiment uses a copolymer of NISS and MMA as a chemical amplification resist, it is also possible to use polyvinyl phenol, a novolac resin, or the like as a compound which reacts with the acid, instead of MMA. As an acid generator, a generator of a sulfonic acid or the like may be used instead of NISS.

Although MTEOS is used as a metal alkoxide, it is also possible to alternatively use another metal alkoxide such as tetramethylorthosilicate or tetraethylorthosilicate.

Although the RIE using an $O_2$ plasma is used as a method of dry development, ECR using an $O_2$ plasma or the like may be used instead.

Although the KrF excimer laser light is used as the light source for exposure, ArF excimer laser light or an X-ray may be used instead.

Although water is kept on the surface of the resist film 31 in the step of diffusing water in the surface of the exposed portion 31a of the resist film 31, it is also possible to alternatively keep the semiconductor substrate 30 in water vapor.

Fourth Embodiment

FIGS. 8(a) to 8(c) and FIGS. 9(a) to 9(c) are cross sections showing individual steps of a method of forming a micropattern according to a fourth embodiment of the present invention. As a chemical amplification resist, the fourth embodiment uses a copolymer of NISS and MMA.

Figure 8A:
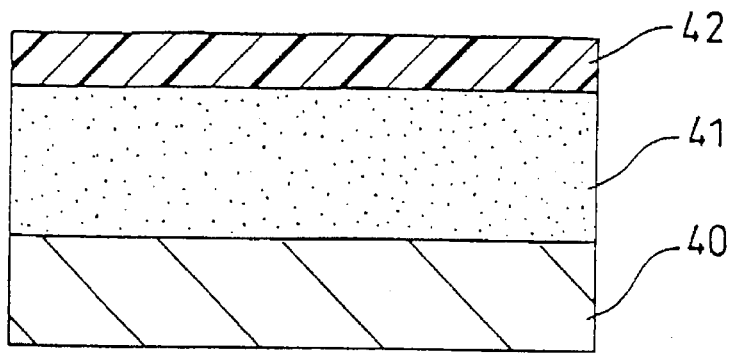
FIGS. 8(a) to 8(c) and FIGS. 9(a) to 9(c) are cross sections showing individual steps of a method of forming a micropattern according to a fourth embodiment of the present invention.

Initially, as shown in FIG. 8(a), a resist composed of the above chemical amplification resist is applied onto a semiconductor substrate 40 made of silicon by spin coating and then heated for 60 seconds at a temperature of 90° C., thereby forming a resist film 41 with a thickness of 1.2 µm. Onto the resulting resist film 41 is then applied a contrast enhanced resin containing 5-diazo-meldrum's acid by spin coating and then heated for 60 seconds at a temperature of 90° C., thereby forming a resin film 42 with a thickness of 0.1 µm.

Figure 8B:
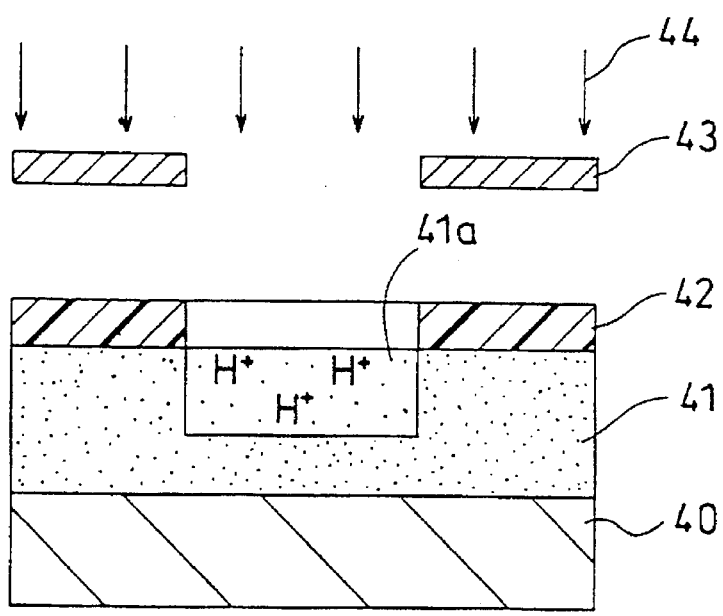

Next, as shown in FIG. 8(b), the resist 41 is then irradiated with KrF excimer laser 44 as an energy beam through a mask 43, thereby transferring the pattern of the mask 43 to the resist film 41. As a result, NISS is decomposed in the surface of an exposed portion 41a of the resist film 41 to generate an acid, which renders the surface of the exposed portion 41a of the resist film 41 hydrophilic. In this case, 5-diazo-meldrum's acid contained in the resin film 42 is decomposed by the KrF excimer laser light 44, thereby increasing the transmittance with respect to the KrF excimer laser light 44. Consequently, the contrast of light intensity on the surface of the resist film 41 is enhanced, so that the acid is efficiently generated in the exposed portion 41a. The generation of the acid renders the surface of the exposed portion 41a of the resist film 41 hydrophilic.

Figure 8C:
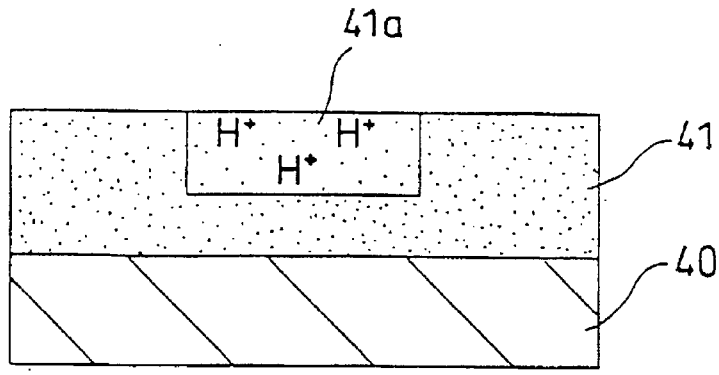

Next, as shown in FIG. 8(c), after removing the resin film 42, the semiconductor substrate 40 is kept in air at a temperature of 30° C. and a relative humidity of 95% for a specified period of time, thereby supplying water vapor 45 to the surface of the resist film 41. As a result, the surface of the exposed area 41a of the resist film 41 absorbs the water vapor 45, so that water is diffused from the surface of the exposed portion 41a of the resist film 41 into a deep portion, e.g., a portion 100 nm deep.

Next, vapor 46 of MTEOS is sprayed onto the surface of the resist film 41 for 3 minutes, while the semiconductor substrate 40 is kept in the air at a temperature of 30° C. and a relative humidity of 95%, thereby selectively forming an oxide film 47 on the surface of the exposed portion 41a of the resist film 41. In this case, the acid resulting from the decomposition of NISS serves as a catalyst and induces a reaction as represented by the above [Formula 2], thereby forming the oxide film 47 and generating an alcohol.

Figure 9A:
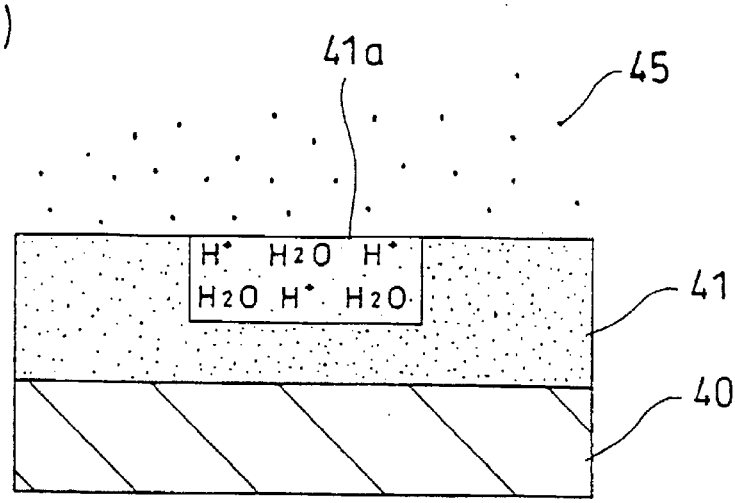
Figure 9B:
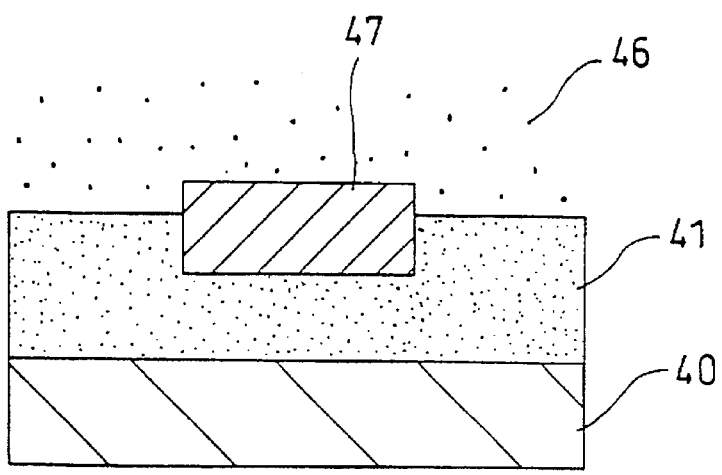
Figure 9C:
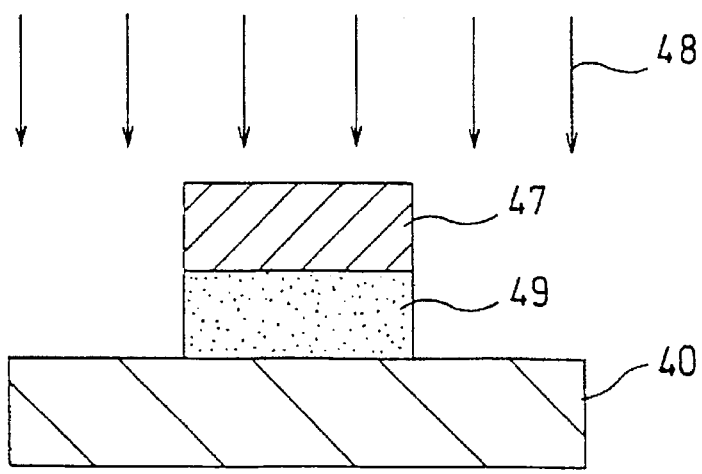

Next, as shown in FIG. 9(c), RIE is conducted using an $O_2$ plasma 48 through the cured oxide film 47 serving as a mask, thereby forming a resist pattern 49. In this case, the RIE using an $O_2$ plasma is conducted by means of a parallel plate RIE apparatus under the conditions of power: 900 W, pressure: 0.7 Pa, and flow rate: 40 SCCM.

Thus, according to the fourth embodiment, the oxide film 47 is selectively formed on the surface of the resist film 41 and the RIE using an $O_2$ plasma is performed with respect to the resist film 41 through the oxide film 47 as a mask, thereby conducting dry development. As a result, the problem of pattern collapse due to wet development is eliminated, while the oxide film excellently retains its initial configuration. Consequently, a micropattern with a high aspect ratio can be formed with high precision. Moreover, in the step of diffusing water in the exposed portion 41a of the resist film 41, the depth reached by diffused water can be controlled by regulating the period during which the water vapor 45 is supplied, i.e., the period during which the semiconductor substrate 40 is kept in the air at a temperature of 30° C. and a relative humidity of 95%. Similarly to the first embodiment, water is preferably diffused from the surface of the resist film 41 to a depth of 100 nm or more, since this prevents the oxide film 47 from flowing.

Although the fourth embodiment uses a copolymer of NISS and MMA as a chemical amplification resist, it is also possible to use polyvinyl phenol, a novolac resin, or the like as a compound which reacts with the acid, instead of MMA. As an acid generator, a generator of a sulfonic acid or the like may be used, instead of NISS. Although the fourth embodiment uses a resin containing 5-diazo-meldrum's acid as a contrast enhanced resin, another resin containing diazoketone or diazodiketone may be used instead.

Although MTEOS is used as a metal alkoxide, it is also possible to alternatively use another metal alkoxide such as tetramethylorthosilicate or tetraethylorthosilicate.

Although the RIE using an $O_2$ plasma is used as a method of dry development, ECR using an $O_2$ plasma or the like may be used instead.

Although the KrF excimer laser light is used as a light source for exposure, it is also possible to alternatively use ArF excimer laser light or an X-ray.

Although the semiconductor substrate 40 is kept in the water vapor in the step of diffusing water in the surface of the exposed portion 41a of the resist film 41, it is also possible to alternatively supply water to the resist film 41 overlying the semiconductor substrate 40.

Fifth Embodiment

FIGS. 10(a) to 10(c) to FIGS. 12(a) and 12(b) are cross sections showing individual steps of a method of forming a micropattern according to a fifth embodiment of the present invention. As a chemical amplification resist, the fifth embodiment uses a copolymer of NISS and MMA.

Figure 10A:
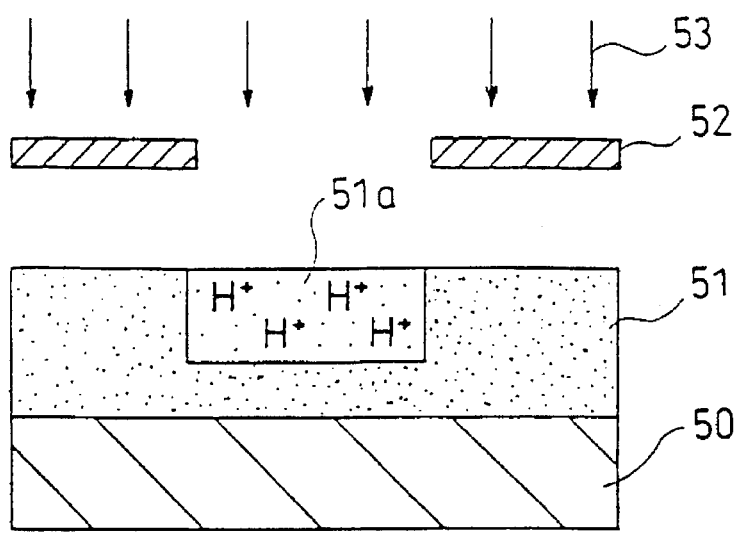

Initially, as shown in FIG. 10(a), a resist composed of the above chemical amplification resist is applied onto a semiconductor substrate 50 made of silicon by spin coating and then heated for 60 seconds at a temperature of 90° C., thereby forming a resist film 51 with a thickness of 1.2 µm. The resulting resist film 51 is then irradiated with KrF excimer laser light 53 as an energy beam through a mask 52, thereby transferring the pattern of the mask 52 to the resist film 51 by exposure. As a result, NISS is decomposed in the surface of an exposed portion 51a of the resist film 51 to generate an acid, which renders the surface of the exposed portion 51a of the resist film 51 hydrophilic.

Figure 10B:
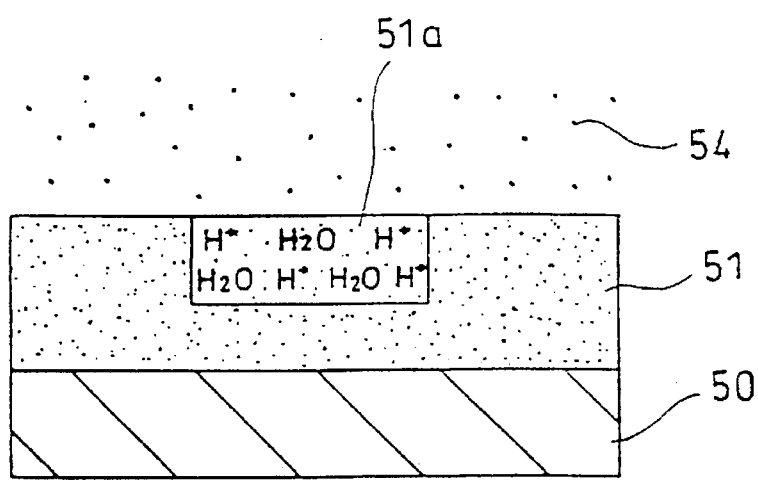

Next, as shown in FIG. 10(b), the semiconductor substrate 50 is kept in air at a temperature of 30° C. and a relative humidity of 95% for a specified period of time, thereby supplying water vapor 54 to the surface of the resist film 51. As a result, the surface of the exposed area 51a of the resist film 51 absorbs the water vapor 54, so that water is diffused from the surface of the exposed portion 51a of the resist film 51 into a deep portion, e.g., a portion 100 nm deep.

Figure 10C:
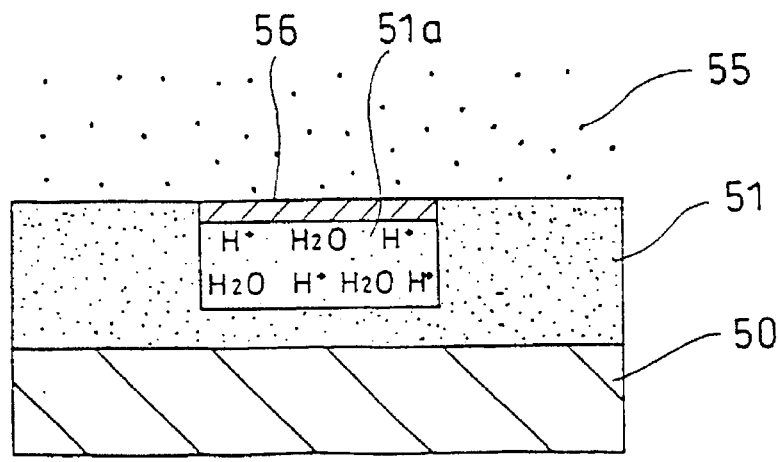

Next, as shown in FIG. 10(c), vapor 55 of MTEOS is sprayed onto the surface of the resist film 51 for, e.g., 30 seconds, while the semiconductor substrate 50 is kept in the air at a temperature 30° C. and a relative humidity of 95%. As a result, an oxide film 56 is formed on the surface of the exposed portion 51a of the resist film 51.

Figure 11A:
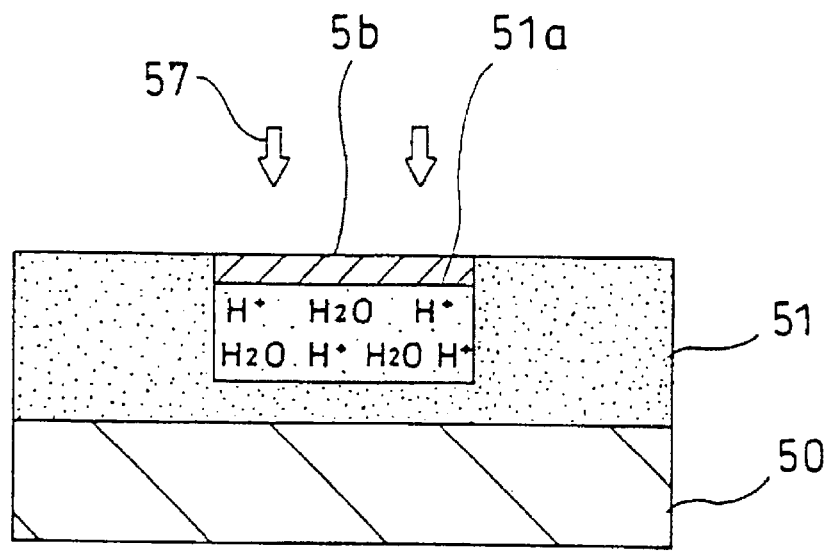
Figure 11B:
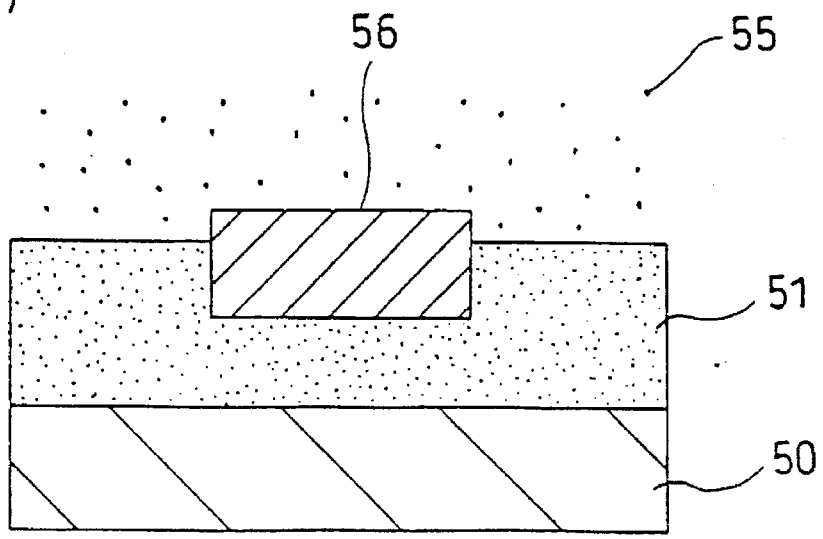

Next, as shown in FIG. 11(a), a dry nitrogen gas 57 is sprayed onto the surface of the resist film 51 for, e.g., 30 seconds, thereby evaporating the alcohol contained in the oxide film 56. Thereafter, the spraying of the vapor 55 of MTEOS and the spraying of the nitrogen gas 57, each described above, are alternately performed about six times, thereby changing the entire exposed portion 51a of the resist film 51 into the oxide film 56. Thus, by alternately performing the processes of supplying the vapor 55 of MTEOS and drying with the nitrogen gas 57 several times, the alcohol imparting mobility to the oxide film 56 is completely evaporated, so that the configuration of the oxide film 56 is remarkably improved.

Next, as shown in FIG. 12(b), RIE is conducted using an $O_2$ plasma 58 through the oxide film 56 as a mask, thereby forming a resist pattern 59. In this case, the RIE using the $O_2$ plasma is conducted by means of a parallel plate RIE apparatus under the conditions of power: 900 W, pressure: 0.7 Pa, and flow rate: 40 SCCM.

Although the fifth embodiment uses a copolymer of NISS and MMA as a chemical amplification resist, it is also possible to use polyvinyl phenol, a novolac resin, or the like as a compound which reacts with the acid, instead of MMA. As an acid generator, a generator of a sulfonic acid or the like may be used instead of NISS.

Although MTEOS is used as a metal alkoxide, it is also possible to alternatively use another metal alkoxide such as tetramethylorthosilicate or tetraethylorthosilicate.

Although the RIE using the $O_2$ plasma is used as a method of dry development, ECR using an $O_2$ plasma or the like may be used instead.

Although the KrF excimer laser light is used as a light source for exposure, ArF excimer laser light or an X-ray may be used instead.

Although the semiconductor substrate 50 is kept in the water vapor in the step of diffusing water in the surface of the exposed portion 51a of the resist film 51, it is also possible to alternatively supply liquid water to the resist film 51 overlying the semiconductor substrate 50.

Sixth Embodiment

FIGS. 13(a) to 13(c) and FIGS. 14(a) and 14(b) are cross sections showing individual steps of a method of forming a micropattern according to a sixth embodiment of the present invention. As a chemical amplification resist, the present embodiment uses a resist containing an acid generator which generates an acid in response to the radiation of an energy beam and a compound which reacts with the acid, such as SAL601 ER7 commercially available from Shipley Company.

Figure 18A:
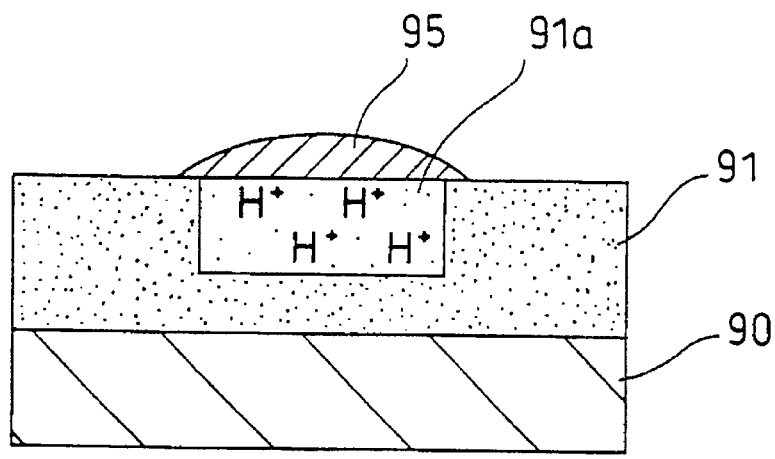
Figure 18B:
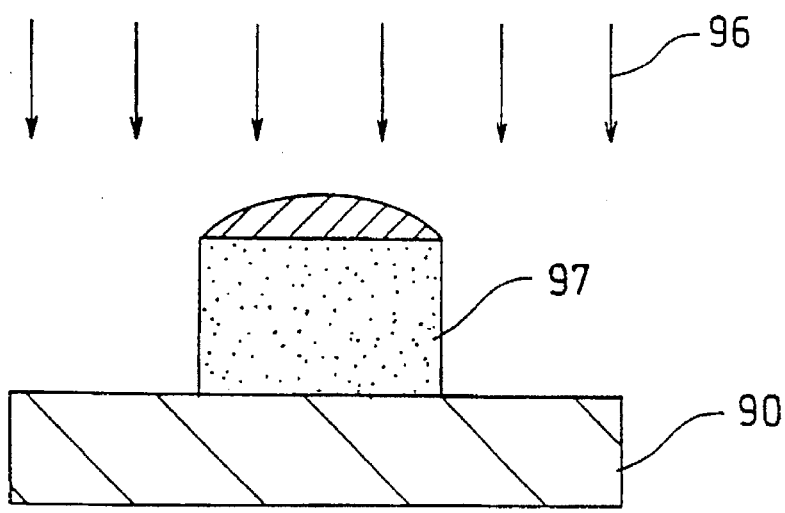
Figure 19:
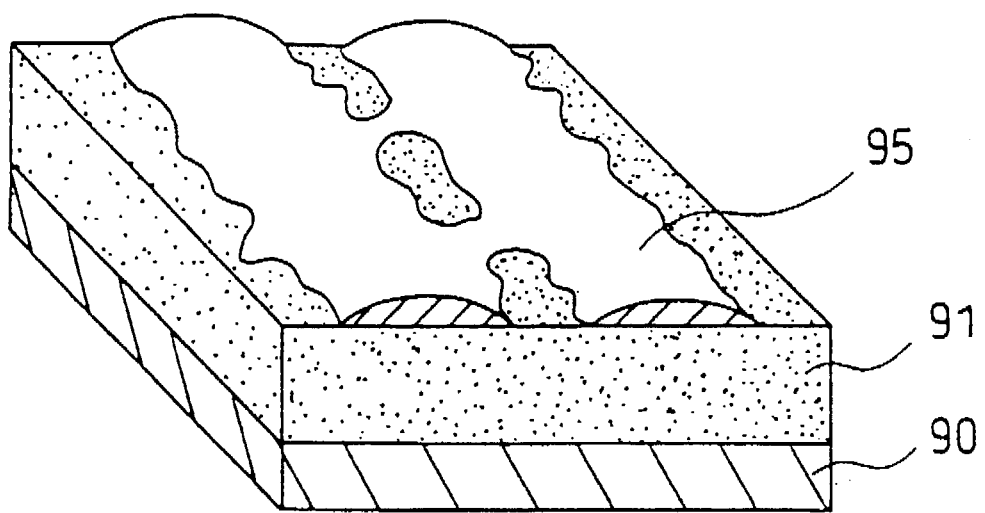
FIG. 19 is a perspective cross section for illustrating a disadvantage of the second conventional method of forming a micropattern.

Initially, as shown in FIG. 18(a), a resist film 61 composed of the above chemical amplification resist is formed on a semiconductor substrate 60 made of silicon. The resulting resist film 61 is then irradiated with KrF excimer laser light 63 as an energy beam through a mask 62, thereby transferring the pattern of the mask 62 to the resist film 61 by exposure. As a result, an acid is generated in the surface of an exposed portion 61a of the resist film 61.

Next, crosslinking is caused in the exposed portion 61a of the resist film 61 by applying heat at a temperature of 110° C. for 60 seconds, thereby forming a crosslinked portion 64, as shown in FIG. 13(b).

Subsequently, as shown in FIG. 13(c), a silylating solution 64 is kept on the surface of the resist film 61 for 1 minute to form a silylated layer 66 in an unexposed portion of the resist film 61, followed by rinsing with xylene. The silylating solution 65 is a mixture of 10 wt % of hexamethylcyclotrisilazane, 2 wt % of 1-methyl-2-pyrrolidone, and 88 w % of xylene.

Figure 14A:
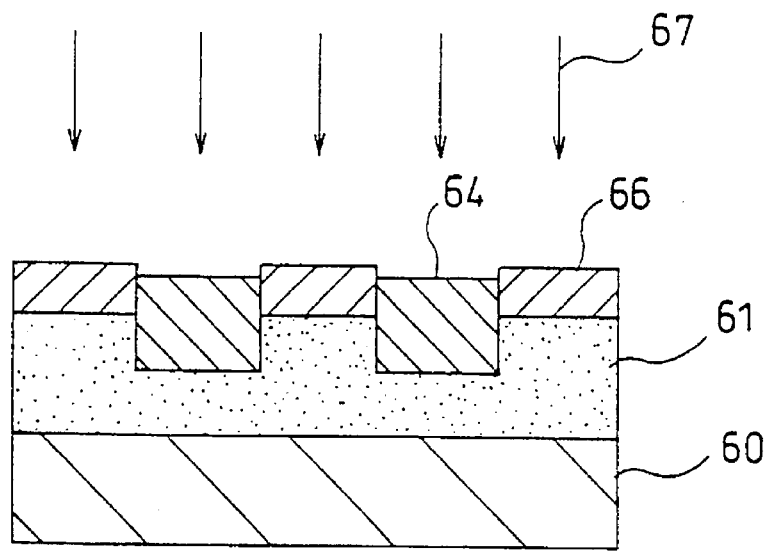

Next, as shown in FIG. 14(a), the silylated layer 66 is irradiated with a deep ultraviolet ray 67 as a high energy beam for 60 seconds, while heating the semiconductor substrate 60 to 110° C., thereby increasing the selectivity to the silylated layer 66 and the resist film 61. Since the silylated layer has not been irradiated with the high energy beam in a conventional embodiment, the reaction between silicon and the resist film does not proceed to a satisfactory degree, resulting in a low selectivity to the silylated layer and the resist film. However, since the silylated layer 66 selectively formed is irradiated with the deep ultraviolet ray 67 in the sixth embodiment, a carbon compound composing the resist undergoes oxidative decomposition and volatilization, resulting in an increased concentration of silicon in the silylated layer 66 and a high selectivity to the silylated layer 66 and the resist film 61.

Figure 14B:
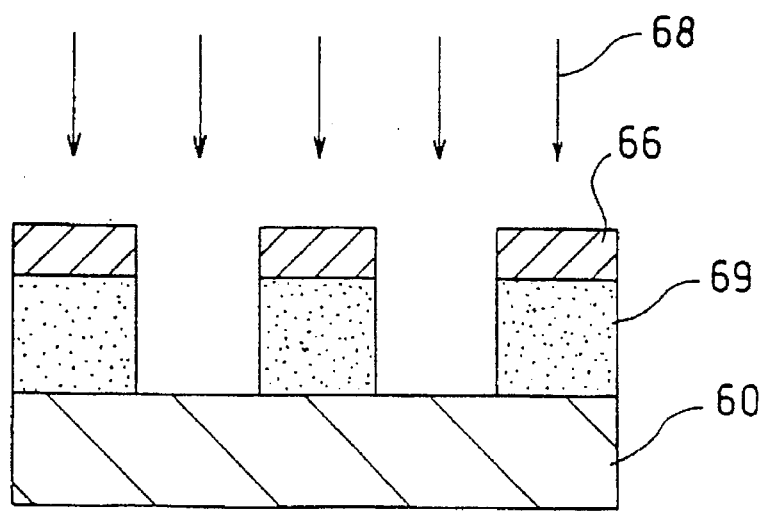

Next, as shown in FIG. 14(b), RIE is conducted using an $O_2$ plasma 68 through the silylated layer 66 serving as a mask, thereby forming a resist pattern 69. In this case, the RIE using the $O_2$ plasma is conducted by means of a parallel plate RIE apparatus under the conditions of power: 900 W, pressure: 0.7 Pa, and flow rate: 40 SCCM.

TABLE 2

| RADIATION OF DEEP ULTRAVIOLET RAY | ETCHING RATE FOR SILYLATED LAYER (UNEXPOSED) PORTION) (nm/min) | ETCHING RATE FOR UNSILYLATED LAYER (EXPOSED PORTION) (nm/min) | ETCHING SELECTIVITY |
|---|---|---|---|
| PRESENT | 8.3 | 188.4 | 22.7 |
| ABSENT | 31.4 | 188.4 | 6.0 |

[Table 2] shows the etching rates for the silylated layer and unsilylated layer of the resist film and the etching selectivity to the silylated layer and unsilylated layer in the respective cases of the sixth embodiment and conventional embodiment. As shown in [Table 2], the etching selectivity in the case of not processing with the radiation of the deep ultraviolet ray (conventional embodiment) is 6, while the etching selectivity in the case of processing with the radiation of the deep ultraviolet ray (sixth embodiment) is 22.7, which indicates that the etching selectivity has increased by three times or more. In the case of not processing with the radiation of the deep ultraviolet ray, the obtained etching selectivity is low, so that there arise the problems of deterioration of pattern configuration and difficulty in forming a pattern with a high aspect ratio. In the sixth embodiment, however, the etching selectivity is increased by the irradiation of the silylated layer 66 with the deep ultraviolet ray 65, so that a pattern with a high aspect ratio can be formed without suffering from pattern collapse and deterioration of its configuration.

Although the sixth embodiment uses SAL601 ER7 available from Shipley Company as a chemical amplification resist, it is also possible to alternatively use a resist having polyvinyl phenol, a novolac resin, or the like as a compound which reacts with the acid.

Although the mixture of hexamethylcyclotrisilazane, 1-methyl-2-pyrrolidone, and xylene is used as a silylating solution, another silylating agent, such as bis (dimethylamino)dimethylsilane, may be used instead of hexamethylcyclotrisilazane and propylene-glycol-methyl-ether-acetate may be used instead of 1-methyl-2-pyrrolidone.

Although the RIE using the $O_2$ plasma is used as a method of dry development, ECR (electron cyclotron resonance etching) using an $O_2$ plasma or the like may be used instead.

Although the KrF excimer laser light is used as a light source for exposure, ArF excimer laser light or an X-ray may be used instead.

Seventh Embodiment

Below, a description will be given to a method of forming a micropattern according to a seventh embodiment of the present invention. The seventh embodiment uses a chemical amplification resist containing, as its main components, an acid generator which generates an acid in response to the radiation of an energy beam and a polymer or monomer in which at least a part of a phenolic hydroxy group is substituted by a protecting group eliminated by the action of the acid. Initially, the above chemical amplification resist is applied dropwise onto a semiconductor substrate, followed by spin coating for forming a resist film with a thickness of 1.0 μm. The resulting resist film is then subjected to 1-minute baking on a hot plate at 90° C.

Specific examples of the above polymer in which at least a part of a phenolic hydroxy group is substituted by a protecting group eliminated by the action of the acid are poly(p-tert-butoxycarbonyloxystyrene), poly(p-tert-butoxystyrene), poly(p-tetrahydropyranyloxystyrene), poly (p-(1-ethoxyethoxy)styrene), poly(p-(1-methoxy-1-methylethoxy)styrene), poly(p-trimethylsilyloxystyrene), poly(p-tert-butoxycarbonyloxystyrene-p-hydroxystyrene), poly(p-tert-butoxystyrene-p-hydroxystyrene), poly(p-tetrahydropyranyloxystyrene-p-hydroxystyrene), poly(p-(1-ethoxyethoxy)styrene-p-hydroxystyrene), poly(p-(1-methoxy-1-methylethoxy)styrene-p-hydroxystyrene), poly (p-trimethylsilyloxystyrene-p-hydroxystyrene), poly(p-tert-butoxycarbonylmethoxystyrene-p-hydroxystyrene), and the like, but they are not limited thereto.

Specific examples of the above monomer in which at least a part of a phenolic hydroxy group is substituted by a protecting group eliminated by the action of the acid are 2,2-bis(4-tetrahydropyranyloxyphenyl)propane, 2,2-bis(4-tert-butoxyphenyl)propane, 2,2-bis(4-tert-butoxycarbonyloxyphenyl)propane, 2,2-bis(4-(1-ethoxyethoxy)phenyl)propane, 3,4-dihydro-4-(2,4-di-(1-tetrahydropyranyloxy)phenyl)-7-(1-tetrahydropyranyloxy)-2,2,4-trimethyl-2H-1-benzopyran, 3,4-dihydro-4-(2,4-di-(1-tert-butoxy)phenyl)-7-(1-tert-butoxy)-2,2,4-trimethyl-2H-1-benzopyran, 3,4-dihydro-4-(2,4-di-(1-ethoxyethoxy)phenyl) -7-(1-ethoxyethoxy)-2,2,4-trimethyl-2H-1-1-benzopyran, and the like, but they are not limited thereto.

The following are the compositions of materials of typical chemical amplification resists.

| (1st Example of Resist Materials) | |
|---|---|
| poly(p-tert-butoxycarbonyloxystyrene-p-hydroxystyrene) (weight-average molecular weight of approximately 9500, monomer unit ratio of approximately 1:1) | 6.0 g |
| triphenylsulfonium hexafluorophosphate | 0.3 g |
| diethylene glycol dimethyl ether | 13.7 g |
| (2nd Example of Resist Materials) | |
| poly(p-(1-ethoxyethoxy)styrene-p-hydroxystyrene) (weight-average molecular weight of approximately 10000, monomer unit ratio of approximately 1:1) | 6.0 g |
| 2-cyclohexylcarbonyl-2-(p-toluenesulfonyl)propane | 0.3 g |
| diethylene glycol dimethyl ether | 13.7 g |
| (3rd Example of Resist Materials) | |
| poly p-vinylphenol (weight-average molecular weight of approximately 10000) | 5.0 g |
| 2,2-bis(4-tetrahydropyranyloxyphenyl)propane | 1.5 g |
| 2-cyclohexylcarbonyl-2-(p-toluenesulfonyl)propane | 0.3 g |
| diethylene glycol diethyl ether | 13.2 g |
| (4th Example of Resist Materials) | |
| poly(p-tert-butoxystyrene-p-hydroxystyrene) (weight-average molecular weight of approximately 10000, monomer unit ratio of approximately 1:1) | 6.0 g |
| bis-cyclohexylsulfonyldiazomethane | 0.3 g |
| diethylene glycol diethyl ether | 13.7 g |
| (5th Example of Resist Materials) | |
| poly p-vinylphenol (weight-average molecular weight of approximately 20000) | 5.0 g |
| 3,4-dihydro-4-(2,4-di-(1-ethoxyethoxy)phenyl)-7-(1-ethoxyethoxy)-2,2,4-trimethyl-2H-1-benzopyrane | 1.5 g |
| 2-cyclohexylcarbonyl-2-(p-toluenesulfonyl)propane | 0.3 g |
| 3-methoxy-methyl propionate | 13.2 g |
| (6th Example of Resist Materials) | |
| poly(p-tetrahydropyranyloxystyrene-p-hydroxystyrene) (weight-average molecular weight of approximately 10000, monomer unit ratio of approximately 3:7) | 6.0 g |
| 2-cyclohexylcarbonyl-2-(p-toluenesulfonyl)propane | 0.3 g |
| 2-heptanone | 13.7 g |
| (7th Example of Resist Materials) | |
| poly(p-(1-methoxy-1-methylethoxy)styrene-p-hydroxystyrene) (weight-average molecular weight of approximately 10000, monomer unit ratio of approximately 1:1) | 6.0 g |
| p-toluenesulfonic acid 2,6-dinitrobenzyl | 0.1 g |
| diethylene glycol dimethyl ether | 13.9 g |
| (8th Example of Resist Materials) | |
| m-cresol novolac resin | 5.0 g |
| p-tetrahydropyranyloxystyrene (weight-average molecular weight of approximately 10000) | 0.6 g |
| triphenylsulfonium hexafluorophosphate | 0.1 g |
| diethylene glycol dimethyl ether | 14.3 g |

Next, the resist film is exposed to light of a wavelength of 248 nm from an excimer stepper having a numerical aperture of 0.42, followed by 1-minute baking on a hot plate at a temperature of 100° C. The resist film is then subjected to 1-minute development with an organic alkaline solution.

Figure 15A:
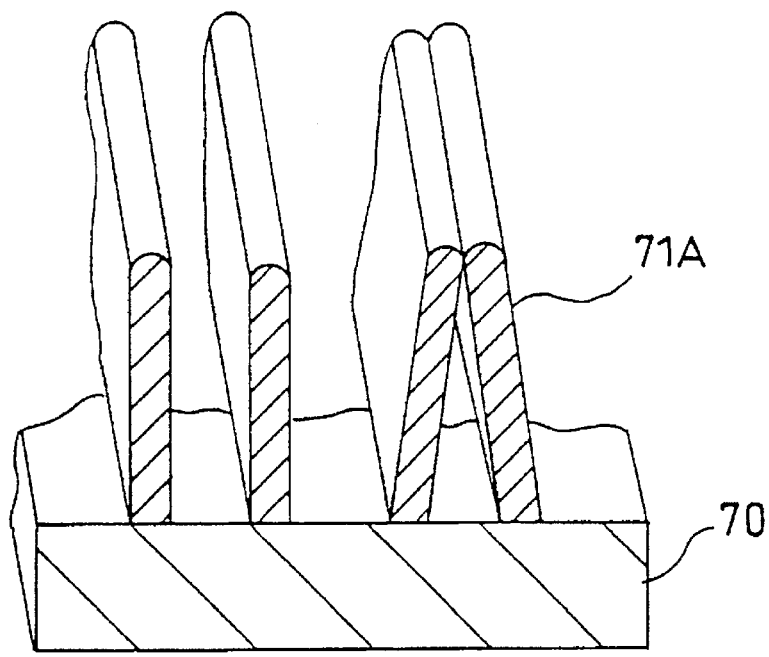
FIG. 15(a) is a perspective cross section of a resist pattern formed in accordance with a conventional method of forming a micropattern and FIG. 15(b) is a perspective cross section of a resist pattern formed in accordance with a method of forming a micropattern according to a seventh embodiment of the present invention.
Figure 15B:
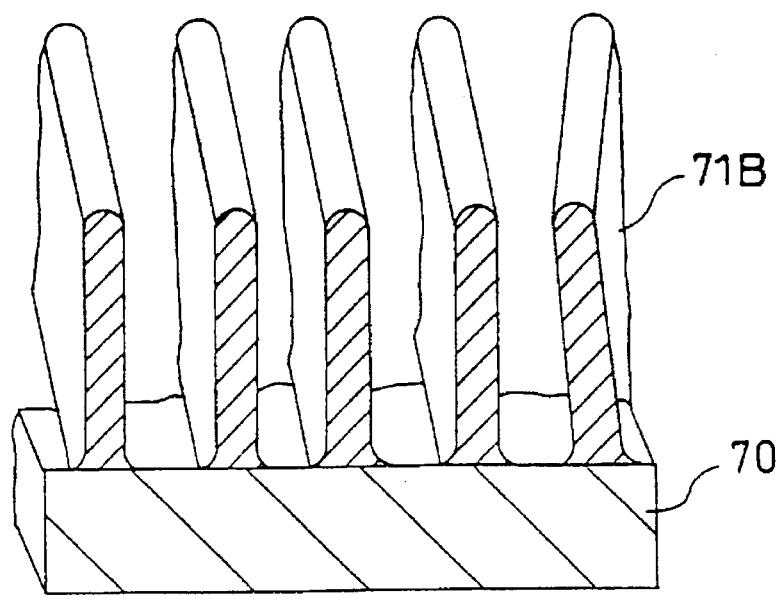
Figure 16A:
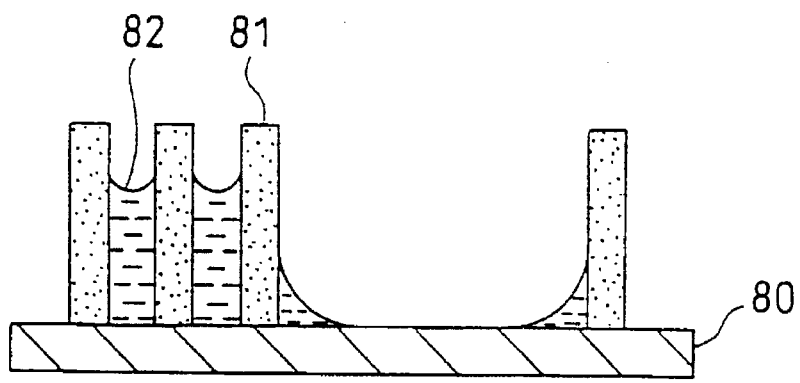
FIGS. 16(a) to 16(c) are cross sections for illustrating a disadvantage of a first conventional method of forming a micropattern.
Figure 16B:
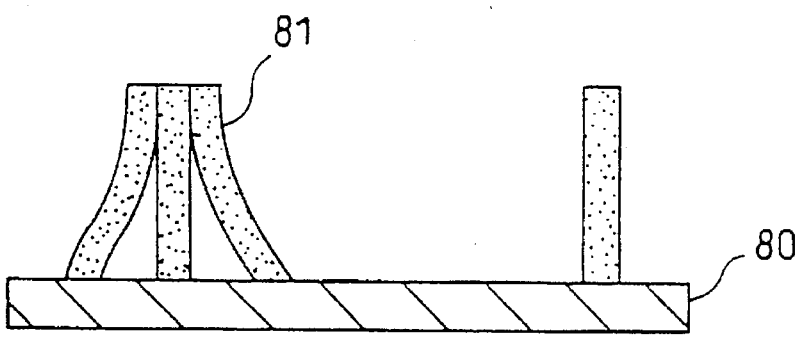
Figure 16C:
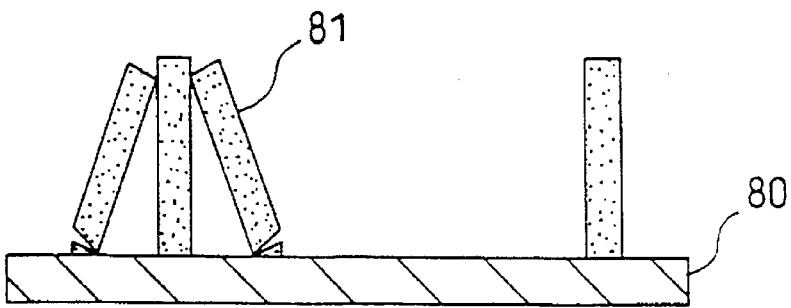
Figure 17A:
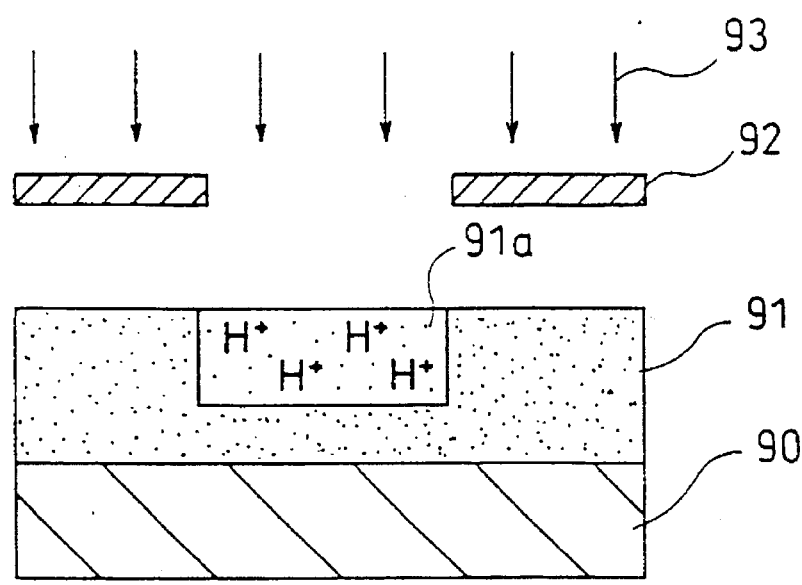
FIGS. 17(a) and 17(b) and FIGS. 18(a) and 18(b) are cross sections showing individual steps of a second conventional method of forming a micropattern.
Figure 17B:
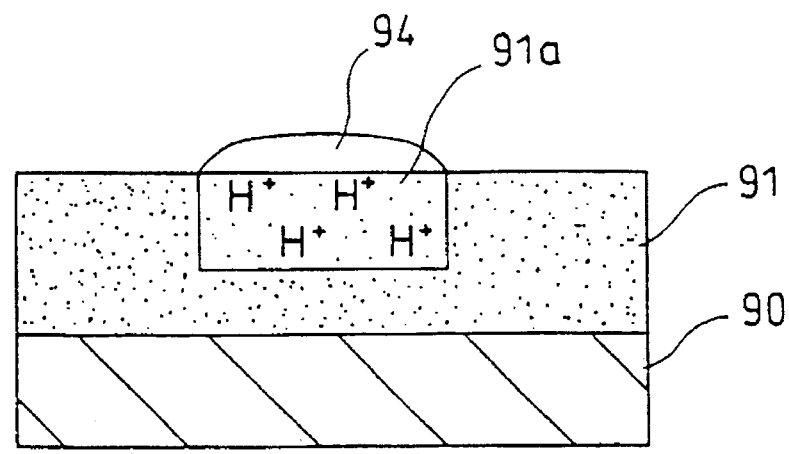

The seventh embodiment is characterized by the process of rinsing with pure water containing 0.1 wt % of a surface-active agent such as polyoxyethylene propylene glycol. As a result, even in a region having a high aspect ratio, a large surface tension is not exerted between adjacent resist patterns, so that the resist patterns are not leaning against their adjacent resist patterns. FIG. 15(a) shows a resist pattern 71A overlying a semiconductor substrate 70, which has been formed by a conventional method similar to the seventh embodiment except for a rinse, while FIG. 15(b) shows a resist pattern 71B overlying the semiconductor substrate 70 formed by the seventh embodiment. As shown in FIG. 15(a), a part of the resist patterns formed by the conventional method are leaning against their adjacent resist patterns. On the another hand, the resist patterns formed by the seventh embodiment are not leaning against any pattern, as shown in FIG. 15(b).

Instead of polyoxyethylene propylene glycol, if polyoxyethylene-p-nonylphenylether, polyoxyethylenecetylether, polyoxyethylenelaurylamineether, or polyoxyethylenelauryl ammonium sulfate ether is used, the same effect can be obtained. The concentration of the surface-active agent is preferably 0.01 to 0.5 wt %, though it is slightly different depending on the type of the surface-active agent.

Although each of the above chemical amplification resists is positive, the method of forming a micropattern according to the seventh embodiment is also effective either in the case of using a negative chemical amplification resist or in the case of using a normal positive or negative resist.

We claim:

1. A method of forming a micropattern comprising:

a first step of forming a resist film by applying, onto a semiconductor substrate, a resist containing a base generator which generates a base in response to the radiation of an energy beam;

a second step of causing the base generator contained in an exposed portion of said resist film to generate the base by irradiating said resist film with the energy beam;

a third step of causing the exposed portion of said resist film, in which the base has been generated, to absorb water;

a fourth step of forming a metal oxide film in the exposed portion of said resist film by supplying water and a metal alkoxide to a surface of the exposed portion of said resist film having absorbed the water;

a fifth step of removing alcohol generated in said metal oxide film formed by said fourth step so as to retain a film of metal oxide having a thickness of about 100 nm or more; and a sixth step of forming a resist pattern by performing dry etching with respect to said resist film by using said film of metal oxide as a mask.

2. A method of forming a micropattern according to claim 1, wherein vapor of the metal alkoxide is used in said fourth step.

3. A method of forming a micropattern according to claim 1, wherein a solution of the metal alkoxide is used in said fourth step.

4. A method of forming a micropattern according to claim 1, wherein the base generated from said base generator in said second step is an amine.

5. The method of forming a micropattern according to claim 1, wherein said fifth step of removing alcohol comprises a step of heating said resist film.

6. The method of forming a micropattern according to claim 1, wherein said fifth step of removing alcohol comprises a step of supplying a dry inert gas to the surface of said resist film.

* * * * *